United States Patent
Miyata et al.

(10) Patent No.: US 12,374,544 B2
(45) Date of Patent: *Jul. 29, 2025

(54) PROCESSING METHOD, METHOD OF MANUFACTURING SEMICONDUCTOR DEVICE, PROCESSING APPARATUS, AND RECORDING MEDIUM

(71) Applicant: Kokusai Electric Corporation, Tokyo (JP)

(72) Inventors: Shoma Miyata, Toyama (JP);
Kimihiko Nakatani, Toyama (JP);
Takayuki Waseda, Toyama (JP);
Takashi Nakagawa, Toyama (JP);
Motomu Degai, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/439,018

(22) Filed: Feb. 12, 2024

(65) Prior Publication Data

US 2024/0186137 A1 Jun. 6, 2024

Related U.S. Application Data

(63) Continuation of application No. 17/477,200, filed on Sep. 16, 2021, now Pat. No. 11,923,191.

(30) Foreign Application Priority Data

Sep. 29, 2020 (JP) ................................ 2020-163759

(51) Int. Cl.
*H01L 21/02* (2006.01)
*C23C 16/04* (2006.01)
(Continued)

(52) U.S. Cl.
CPC ........ *H01L 21/0228* (2013.01); *C23C 16/042* (2013.01); *C23C 16/45529* (2013.01);
(Continued)

(58) Field of Classification Search
None
See application file for complete search history.

(56) References Cited

U.S. PATENT DOCUMENTS 11,923,191 B2 * 3/2024 Miyata .................... C23C 16/40
2014/0145738 A1 5/2014 Huang et al.
(Continued)

FOREIGN PATENT DOCUMENTS

JP 2013-243193 A 12/2013
JP 2017-222928 A 12/2017
TW 202018776 A 5/2020

OTHER PUBLICATIONS

Taiwan Office Action issued on Aug. 4, 2022 for Taiwan Patent Application No. 110131680.

*Primary Examiner* — Asok K Sarkar
(74) *Attorney, Agent, or Firm* — Volpe Koenig

(57) ABSTRACT

A substrate processing technique including: (a) modifying a first base surface of a substrate by supplying a first modifier and a second modifier to the substrate having a surface on which the first base and a second base are exposed, wherein the first modifier contains one or more atoms to which at least one first functional group and at least one second functional group are directly bonded, wherein the second modifier contains an atom to which at least one first functional group and at least one second functional group are directly bonded, and wherein the number of the at least one first functional group contained in one molecule of the second modifier is smaller than the number of the at least one first functional group contained in one molecule of the (Continued)

first modifier; and (b) forming a film on a second base surface by supplying film-forming gas to the substrate.

20 Claims, 9 Drawing Sheets

(51) Int. Cl.
*C23C 16/455* (2006.01)
*C23C 16/52* (2006.01)
*H01J 37/32* (2006.01)
*H01L 21/285* (2006.01)

(52) U.S. Cl.
CPC ........ *C23C 16/52* (2013.01); *H01J 37/32449* (2013.01); *H01L 21/02164* (2013.01); *H01L 21/0217* (2013.01); *H01L 21/28562* (2013.01)

(56) References Cited

U.S. PATENT DOCUMENTS

| | | |
|---|---|---|
| 2015/0162214 A1 | 6/2015 | Thompson et al. |
| 2015/0299848 A1 | 10/2015 | Haukka et al. |
| 2017/0342553 A1 | 11/2017 | Yu et al. |
| 2018/0342391 A1 | 11/2018 | Park et al. |
| 2019/0148144 A1 | 5/2019 | Liu et al. |
| 2020/0168453 A1 | 5/2020 | Saly et al. |
| 2021/0166948 A1 | 6/2021 | Degai et al. |

* cited by examiner

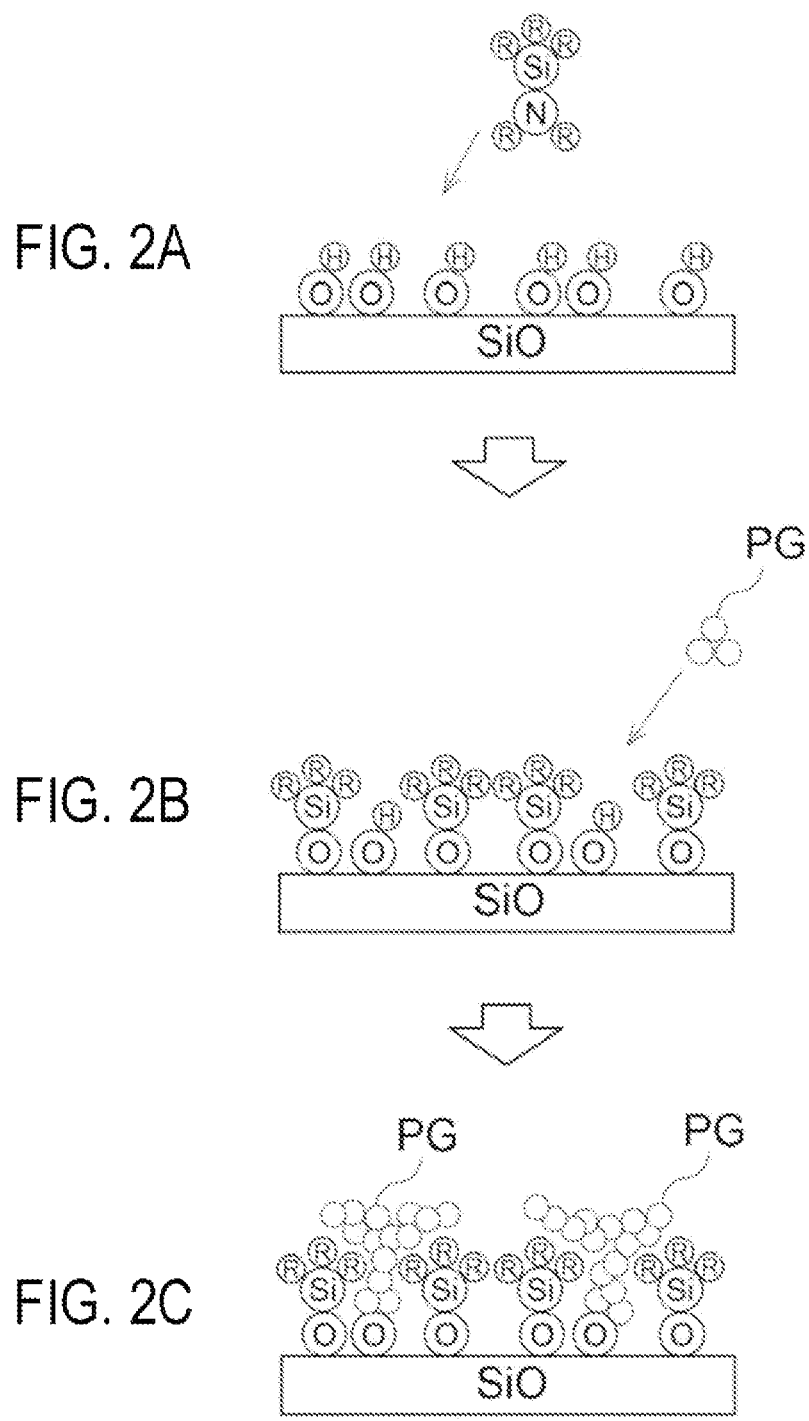

SiO Surface

} 10

} 20

} 30

US 12,374,544 B2

PROCESSING METHOD, METHOD OF MANUFACTURING SEMICONDUCTOR DEVICE, PROCESSING APPARATUS, AND RECORDING MEDIUM

CROSS-REFERENCE TO RELATED APPLICATION

This application is a continuation of U.S. patent application Ser. No. 17/477,200, filed Sep. 16, 2021, which is based upon and claims the benefit of priority from Japanese Patent Application No. 2020-163759, filed on Sep. 29, 2020, the entire contents of which are incorporated herein by reference.

TECHNICAL FIELD

The present disclosure relates to a method of manufacturing a semiconductor device, a method of processing a substrate, a substrate processing apparatus, and a recording medium.

BACKGROUND

In the related art, with the scaling of semiconductor devices, processing dimensions are becoming finer and processes are becoming more complicated. A high-precision patterning process may have to be performed many times, which leads to an increase in costs in semiconductor device manufacture to perform fine and complicated processing. In recent years, selective growth has been attracting attention as a method that can be expected to provide high precision and cost reduction. The selective growth is a technique of forming a film by selectively growing the film on a surface of a desired base among two or more types of bases exposed on a surface of a substrate.

However, when the selective growth is continued, local film formation may proceed even on a surface of a base other than the desired base among two or more types of bases, resulting in a decrease in selectivity.

SUMMARY

Some embodiments of the present disclosure provide a technique of improving selectivity in selective growth.

According to embodiments of the present disclosure, there is provided a technique that includes: (a) modifying a surface of a first base of a substrate by supplying a first modifier and a second modifier to the substrate having a surface on which the first base and a second base are exposed, wherein the first modifier contains one or more atoms to which at least one first functional group and at least one second functional group are directly bonded, wherein the second modifier contains an atom to which at least one first functional group and at least one second functional group are directly bonded, and wherein the number of the at least one first functional groups contained in one molecule of the second modifier is smaller than the number of the at least one first functional groups contained in one molecule of the first modifier; and (b) forming a film on a surface of the second base by supplying a film-forming gas to the substrate after modifying the surface of the first base.

BRIEF DESCRIPTION OF DRAWINGS

The accompanying drawings, which are incorporated in and constitute a part of the specification, illustrate embodiments of the present disclosure.

FIG. 2A is a schematic view showing an example of a structure of OH termination on a surface of a SiO film. FIG. 2B is a schematic view showing a state where after supplying (dialkylamino)trialkylsilane to the surface of the SiO film shown in FIG. 2A, (dialkylamino)trialkylsilane is chemically adsorbed on one of two adjacent OH terminations and OH termination remains. FIG. 2C is a schematic view showing a state where a film-forming precursor is chemically adsorbed on the OH termination remaining on the surface of the SiO film shown in FIG. 2B.

FIG. 8A is a partially-enlarged cross-sectional view of the surface of the wafer 200 on which a first base and a second base are exposed. FIG. 8B is a partially-enlarged cross-sectional view of the surface of the wafer 200 after forming a third modified layer on the surface of the first base by performing Step A. FIG. 8C is a partially-enlarged cross-sectional view of the surface of the wafer 200 after forming a film on the surface of the second base by performing Step B. FIG. 8D is a partially-enlarged cross-sectional view of the surface of the wafer 200 after removing the third modified layer by performing Step C.

DETAILED DESCRIPTION

Figure 1A:
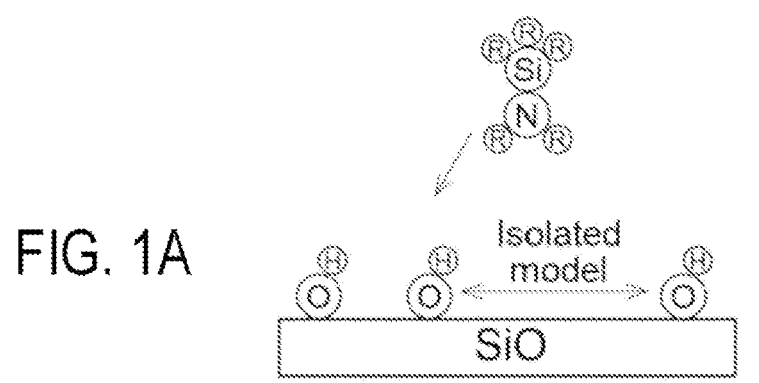
FIG. 1A is a schematic view showing an example of a structure of hydroxyl group (OH) termination on a surface of a silicon oxide film (SiO film).

Selection rupture and a decrease in selectivity in selective growth due to the selection rupture will be now described with reference to Table 1, and FIGS. 1A to 1C and 2A to 2C based on the findings obtained by the present disclosers.

The drawings used in the following description are all schematic, and dimensional relationships, ratios, and the like of the respective elements shown in figures may not match the actual ones. Further, dimensional relationship, ratios, and the like of the respective elements among plural figures may not match each other.

As a selective growth method, there is a method to use an "inhibitor (also referred to as a film-forming inhibitor)" that may be preferentially chemically adsorbed on an adsorption site on the surface of a specific base (referred to as a base A) exposed on the surface of a substrate. In the case of this method, the substrate is exposed to the inhibitor to inhibit film formation on the surface of the base A, and the film is grown on the surface of a base (referred to as a base B) other than the base A, thereby achieving selective growth.

When the inhibitor is chemically adsorbed on the surface of the base A, a reaction between the inhibitor and the film-forming precursor is suppressed due to the chemical stability of a structure derived from the chemically-adsorbed inhibitor. In addition, it is also possible to prevent the film-forming precursor from reaching the surface of the base A due to steric hindrance of the structure derived from the chemically-adsorbed inhibitor. As a result, it is possible to inhibit the film formation on the surface of the base A on which the inhibitor is chemically adsorbed. In this way, a process of modifying the surface of a specific base into a state capable of inhibiting the film formation by using the inhibitor is referred to as "modification." In the present disclosure, a compound itself supplied to a substrate for the purpose of performing the modification is referred to as an inhibitor, but a residue (corresponding to the above-mentioned "structure derived from the chemically-adsorbed inhibitor") of the compound after being chemically adsorbed on the surface of a base to be inhibited for film formation by the modification is also referred to as an inhibitor. That is, when the term "inhibitor" is used in the present disclosure, it may include a "compound supplied to a substrate for the purpose of performing the modification," a "residue of the compound after being chemically adsorbed on the surface of a base to be inhibited for film formation by the modification", or both.

However, in the related-art method of using an inhibitor, in a case where the film formation is continued, local film formation may proceed even on the surface of the base A after the modification. In the present disclosure, the progress of local film formation on the surface of the base A on which the inhibitor is chemically adsorbed (that is, the base A after the modification) is also referred to as "selection rupture." When the selection rupture occurs, a difference between an amount of the film formed on the surface of the base A after the modification and an amount of the film formed on the surface of the base B becomes small, which may cause a decrease in selectivity in the selective growth.

The selection rupture occurs when a film-forming precursor is adsorbed on the surface of the base after the modification. Here, a case where the base to be inhibited for film formation in the modification is a "SiO film" and "(dialkylamino)trialkylsilane (hereinafter also referred to as DAATAS)" having a structure in which one amino group (dialkylamino group) and three alkyl groups are bonded to Si as a center atom is used as an inhibitor will be described as an example.

It is known that the OH termination, which is an adsorption site, exists on the surface of the SiO film and has three structures shown in Table 1 below.

TABLE 1

| | |
|---|---|
| Name | Vicinal |
| Structure | 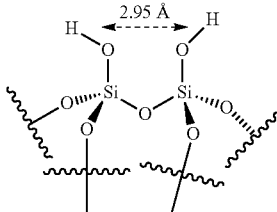 |
| Abundance ratio (~200° C.) | 61% |
| Name | Germinal |
| Structure | 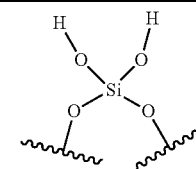 |
| Abundance ratio (~200° C.) | 13% |
| Name | Isolated |
| Structure | 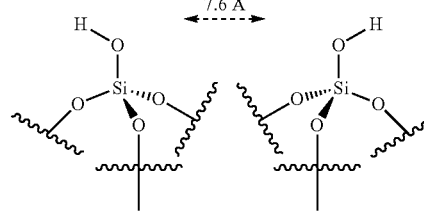 |
| Abundance ratio (~200° C.) | 26% |

DAATAS is chemically adsorbed on the surface of the SiO film when the amino group contained in DAATAS reacts with the OH termination existing on the surface of the SiO film. When DAATAS is chemically adsorbed on the surface of the SiO film, Si, which is the center atom of DAATAS, maintains a state of being bonded to the three alkyl groups. The bond between Si, which is the center atom of DAATAS, and the amino group is cut when the amino group reacts with the OH termination. That is, as a residue derived from DAATAS, a trialkylsilyl group is bonded to the surface of the SiO film. An alkyl group in the trialkylsilyl group is chemically stable and has characteristics of not easily reacting with the film-forming precursor. Further, the steric hindrance caused by the three alkyl groups prevents the film-forming precursor from reaching the surface of the SiO film. Due to this effect, DAATAS and the trialkylsilyl group function as the "inhibitors," and it is possible to selectively inhibit the film formation on the surface of the SiO film.

As a mechanism by which the film-forming precursor is adsorbed on the surface of the SiO film, that is, a mechanism by which selection rupture occurs, even though the film formation may be inhibited on the surface of the SiO film by performing the modification with DAATAS as described above, there may be the following two examples.

1. The film-forming precursor is physically adsorbed on the surface of the SiO film that may not be completely covered by the steric hindrance of the three alkyl groups of DAATAS.

2. DAATAS is not chemically adsorbed, and the film-forming precursor is chemically adsorbed on the OH termination remaining on the surface of the SiO film.

Figure 1B:
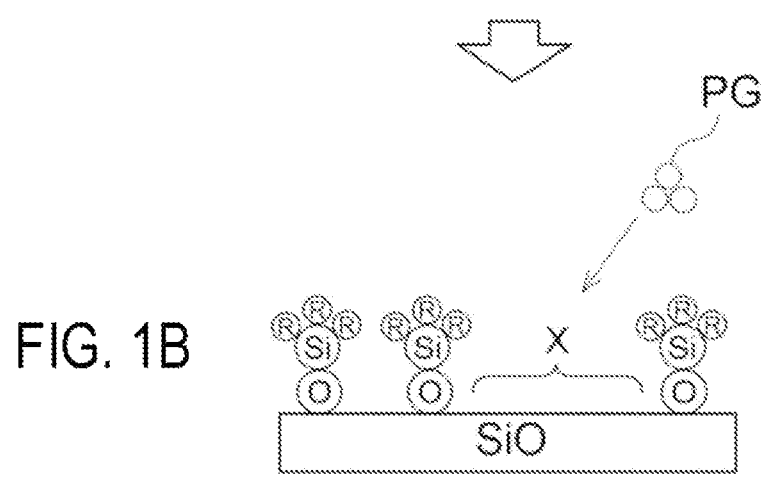
FIG. 1B is a schematic view showing a region x that is formed after supplying (dialkylamino)trialkylsilane to the surface of the SiO film shown in FIG. 1A and may not be completely covered with three alkyl groups derived from (dialkylamino)trialkylsilane.
Figure 1C:
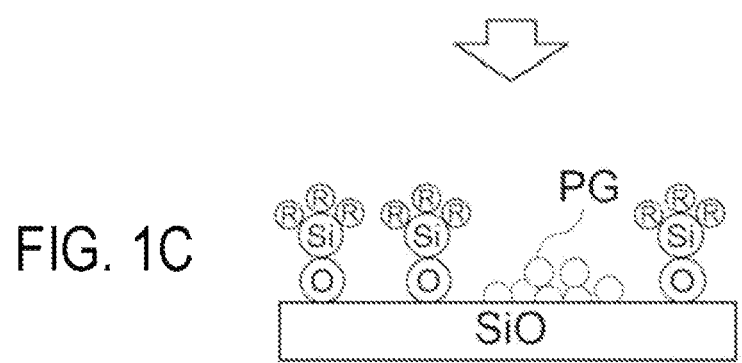
FIG. 1C is a schematic view showing a state where a film-forming precursor is physically adsorbed on the region x of the surface the SiO film shown in FIG. 1B.

First, the aforementioned item 1 will be described with reference to FIGS. 1A to 1C. Here, in FIGS. 1A to 1C, "R" represents an alkyl group. Further, "PG" represents a film-forming precursor (precursor gas).

The physical adsorption of the film-forming precursor on the surface of the SiO film in the item 1 is likely to occur on the surface of the SiO film in a region where an OH termination such as "Isolated" shown in Table 1 exists. This is because since adjacent OH terminations are separated from each other at the OH termination of "Isolated," as shown in FIG. 1A, even after DAATAS is chemically adsorbed on the OH termination, a region x that may not completely cover the surface of the SiO film with the three alkyl groups derived from DAATAS may be formed, as shown in FIG. 1B. In this case, at the time of film formation, that is, when the film-forming precursor is supplied to the substrate after the modification, the film-forming precursor PG is physically adsorbed on the region x of the surface of the SiO film, as shown in FIG. 1C, resulting in selection rupture. It may be considered that a film formation inhibition region due to the steric hindrance of the three alkyl groups is expanded for example by increasing a molecular size of the alkyl group of the inhibitor to suppress the physical adsorption of the film-forming precursor PG on the region x of the surface of the SiO film.

Next, the item 2 will be described with reference to FIGS. 2A to 2C. Here, in FIGS. 2A to 2C, "R" represents an alkyl group. Further, "PG" represents a film-forming precursor (precursor gas).

The chemical adsorption between the OH termination remaining on the surface of the SiO film and the film-forming precursor in the item 2 is likely to occur in a structure in which the OH terminations such as "Vicinal" and "Germinal" shown in Table 1 are present close to each other on the surface of the SiO film. This is because when there are two OH terminations close to the surface of the SiO film, DAATAS may be chemically adsorbed on one of them, as shown in FIG. 2A, and the OH termination remains on the surface of the SiO film, as shown in FIG. 2B. More specifically, when DAATAS is chemically adsorbed on one of the two adjacent OH terminations on the surface of the SiO film, since three alkyl groups derived from DAATAS act as steric hindrance and DAATAS may not be chemically adsorbed on the other OH termination, the OH termination remains on the surface of the SiO film, as shown in FIG. 2B. In this case, at the time of film formation, that is, when the film-forming precursor is supplied to the substrate after the modification, the film-forming precursor PG is chemically adsorbed with the OH termination remaining on the surface of the SiO film, as shown in FIG. 2C, resulting in selection rupture. It may be considered that an inhibitor is chemically adsorbed on each of the two adjacent OH terminations to reduce the remaining OH termination for example by decreasing the molecular size of the alkyl group of the inhibitor to suppress the chemical adsorption between the OH termination remaining on the surface of the SiO film and the film-forming precursor PG.

As a result of diligent research conducted by the present disclosers based on the above-described findings, the present disclosers have discovered a technique of suppressing selection rupture to improve selectivity in selective growth by using two types of inhibitors having specific structures in combination (specifically, by using a first modifier and a second modifier to be described below) at the time of modification. Hereinafter, as embodiments of the present disclosure, an example of a technique of suppressing selection rupture to improve selectivity in selective growth will be described.

Embodiments of the Present Disclosure

Embodiments of the present disclosure will be now described mainly with reference to FIGS. 3 to 6, FIGS. 7A to 7D, and 8A to 8D.

(1) Configuration of Substrate Processing Apparatus

Figure 3:
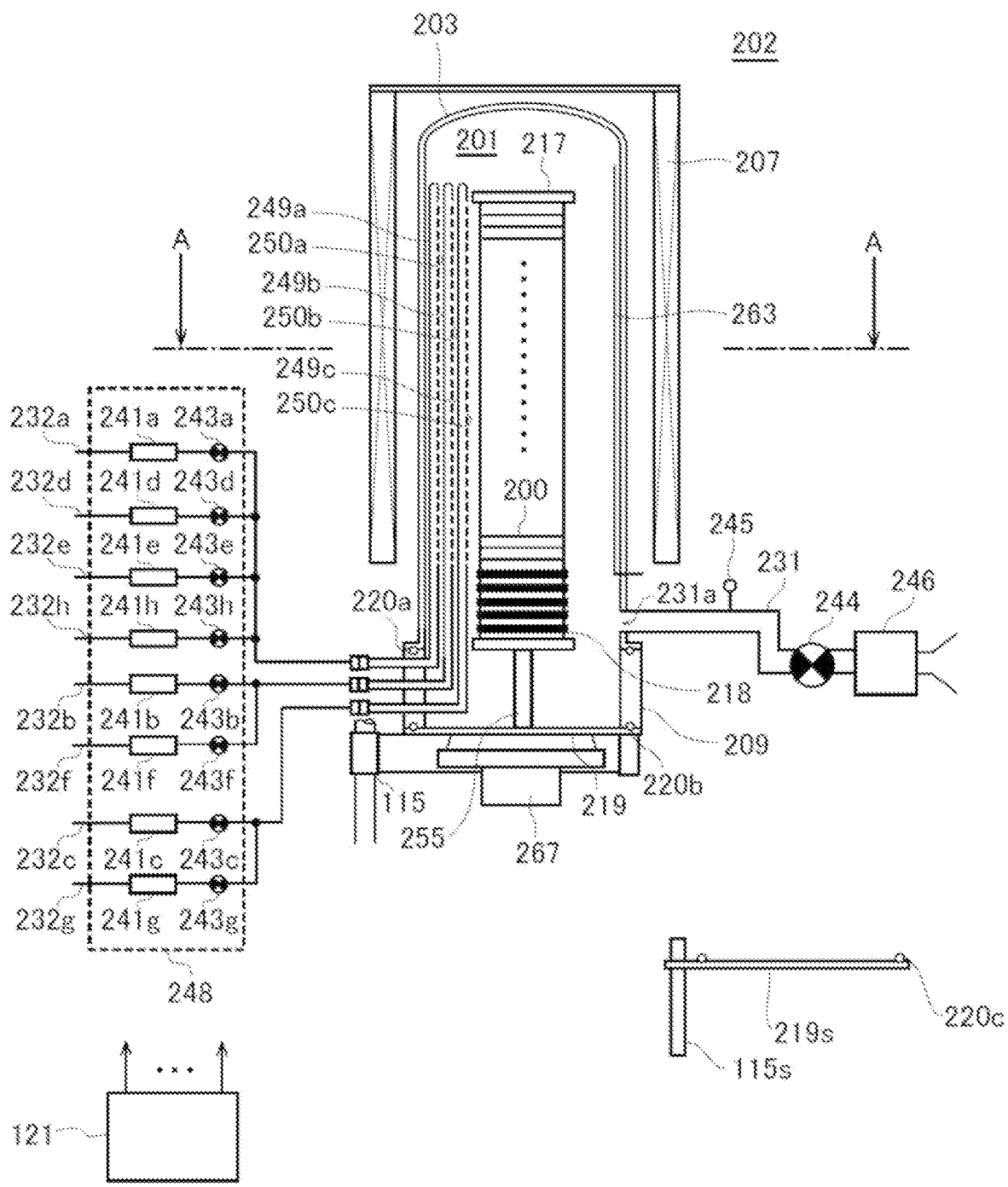
FIG. 3 is a schematic configuration view of a vertical process furnace of a substrate processing apparatus suitably used in embodiments of the present disclosure, in which a portion of a process furnace 202 is shown in a vertical cross section.

As shown in FIG. 3, a process furnace 202 includes a heater 207 as a temperature regulation part (a heating part). The heater 207 has a cylindrical shape and is supported by a support plate to be vertically installed. The heater 207 also functions as an activation mechanism (an excitation part) configured to thermally activate (excite) a gas.

A reaction tube 203 is disposed inside the heater 207 to be concentric with the heater 207. The reaction tube 203 is made of, for example, a heat resistant material such as quartz ($SiO_2$) or silicon carbide (SiC), and has a cylindrical shape with its upper end closed and its lower end opened. A manifold 209 is disposed to be concentric with the reaction tube 203 under the reaction tube 203. The manifold 209 is made of, for example, a metal material such as stainless steel (SUS), and has a cylindrical shape with both of its upper and lower ends opened. The upper end portion of the manifold 209 engages with the lower end portion of the reaction tube 203 to support the reaction tube 203. An O-ring 220a serving as a seal is installed between the manifold 209 and the reaction tube 203. Similar to the heater 207, the reaction tube 203 is vertically installed. A process container (reaction container) mainly includes the reaction tube 203 and the manifold 209. A process chamber 201 is formed in a hollow cylindrical portion of the process container. The process chamber 201 is configured to be capable of accommodating wafers 200 as substrates. Processing on the wafers 200 is performed in the process chamber 201.

Nozzles 249a to 249c as first to third supply parts are installed in the process chamber 201 to penetrate through a sidewall of the manifold 209. The nozzles 249a to 249c are also referred to as first to third nozzles, respectively. The nozzles 249a to 249c are made of, for example, a heat resistant material such as quartz or SiC. Gas supply pipes 232a to 232c are connected to the nozzles 249a to 249c, respectively. The nozzles 249a to 249c are different nozzles, and each of the nozzles 249a and 249c is installed adjacent to the nozzle 249b.

Mass flow controllers (MFCs) 241a to 241c, which are flow rate controllers (flow rate control parts), and valves 243a to 243c, which are opening/closing valves, are installed at the gas supply pipes 232a to 232c, respectively, sequentially from the corresponding upstream sides of a gas flow. Gas supply pipes 232d and 232e are respectively connected to the gas supply pipe 232a at the downstream side of the valve 243a. Gas supply pipes 232f and 232g are connected to the gas supply pipes 232b and 232c at the downstream side of the valves 243b and 243c respectively.

MFCs 241d to 241h and valves 243d to 243h are installed at the gas supply pipes 232d to 232h, respectively, sequentially from the corresponding upstream sides of gas flow. The gas supply pipes 232a to 232h are made of, for example, a metal material such as SUS.

Figure 4:
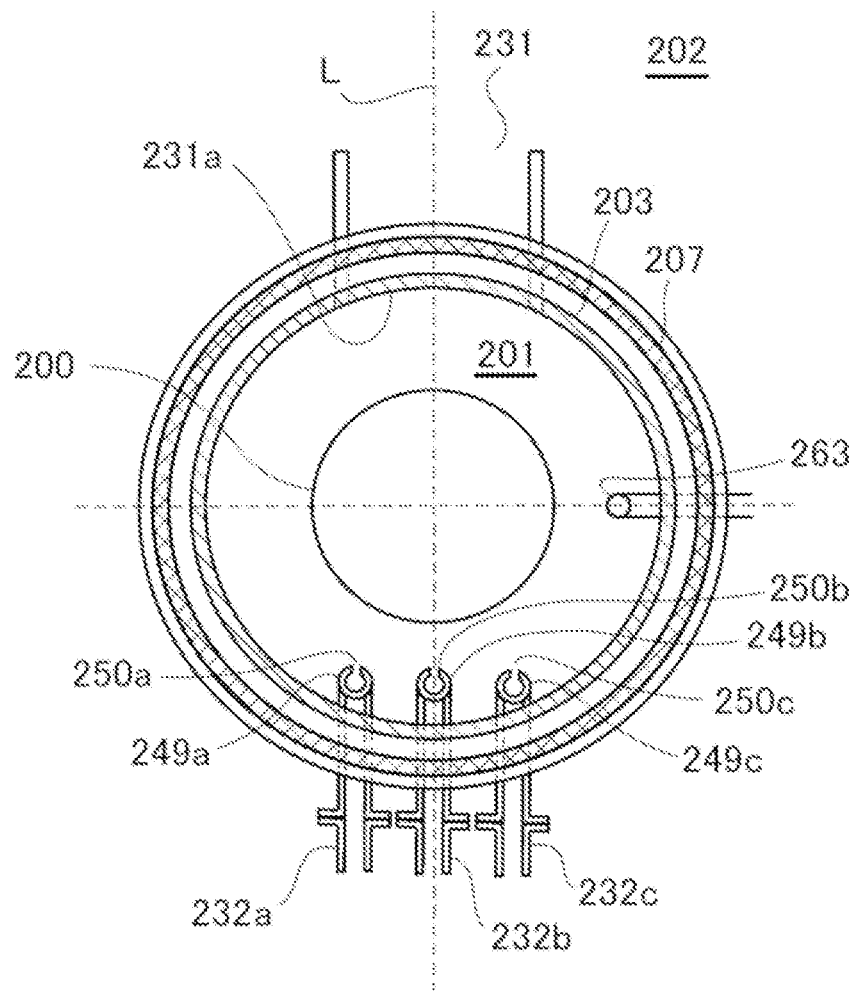
FIG. 4 is a schematic configuration view of a vertical process furnace of a substrate processing apparatus suitably used in embodiments of the present disclosure, in which a portion of a process furnace 202 is shown in a cross section taken along a line A-A in FIG. 3.

As shown in FIG. 4, each of the nozzles 249a to 249c is installed in an annular space (in a plane view) between an inner wall of the reaction tube 203 and the wafers 200 to extend upward from a lower portion to an upper portion of the inner wall of the reaction tube 203, that is, along an arrangement direction of the wafers 200. Specifically, each of the nozzles 249a to 249c is installed in a region horizontally surrounding a wafer arrangement region in which the wafers 200 are arranged at a lateral side of the wafer arrangement region, along the wafer arrangement region. In a plane view, the nozzle 249b is disposed to face an exhaust port 231a to be described below on a straight line with the centers of the wafers 200 loaded into the process chamber 201 interposed between the nozzle 249b and the exhaust port 231a. The nozzles 249a and 249c are arranged to sandwich a straight line L passing through the nozzle 249b and the center of the exhaust port 231a from both sides along the inner wall of the reaction tube 203 (an outer peripheral portion of the wafers 200). The straight line L is also a straight line passing through the nozzle 249b and the centers of the wafers 200. That is, it may be said that the nozzle 249c is installed on the side opposite to the nozzle 249a with the straight line L interposed therebetween. The nozzles 249a and 249c are arranged in line symmetry with the straight line L as an axis of symmetry. Gas supply holes 250a to 250c configured to supply a gas are formed on the side surfaces of the nozzles 249a to 249c, respectively. Each of the gas supply holes 250a to 250c is opened to oppose (face) the exhaust port 231a in the plane view, which enables a gas to be supplied toward the wafers 200. A plurality of gas supply holes 250a to 250c are formed from the lower portion to the upper portion of the reaction tube 203.

A first modifier as a surface modifier is supplied from the gas supply pipe 232a into the process chamber 201 via the MFC 241a, the valve 243a, and the nozzle 249a.

A second modifier as a surface modifier is supplied from the gas supply pipe 232h into the process chamber 201 via the MFC 241h, the valve 243h, the gas supply pipe 232a, and the nozzle 249a.

A precursor gas as a film-forming precursor is supplied from the gas supply pipe 232b into the process chamber 201 via the MFC 241b, the valve 243b, and the nozzle 249b.

A reaction gas and an oxygen (O)- and hydrogen (H)-containing substance are supplied from the gas supply pipe 232c into the process chamber 201 via the MFC 241c, the valve 243c, and the nozzle 249c.

A catalyst gas is supplied from the gas supply pipe 232d into the process chamber 201 via the MFC 241d, the valve 243d, the gas supply pipe 232a, and the nozzle 249a.

An inert gas is supplied from the gas supply pipes 232e to 232g into the process chamber 201 via the MFCs 241e to 241g, the valves 243e to 243g, the gas supply pipes 232a to 232c, and the nozzles 249a to 249c, respectively. The inert gas acts as a purge gas, a carrier gas, a dilution gas, or the like.

A first modifier supply system (first surface modifier supply system) mainly includes the gas supply pipe 232a, the MFC 241a, and the valve 243a. A second modifier supply system (second surface modifier supply system) mainly includes the gas supply pipe 232h, the MFC 241h, and the valve 243h. The first modifier supply system and the second modifier supply system are also referred to as a modifier supply system (surface modifier supply system). A precursor gas supply system mainly includes the gas supply pipe 232b, the MFC 241b, and the valve 243b. A reaction gas supply system or an O- and H-containing substance supply system mainly includes the gas supply pipe 232c, the MFC 241c, and the valve 243c. A catalyst gas supply system mainly includes the gas supply pipe 232d, the MFC 241d, and the valve 243d. An inert gas supply system mainly includes the gas supply pipes 232e to 232g, the MFCs 241e to 241g, and the valves 243e to 243g.

Since the first modifier and the second modifier act as an inhibitor, the modifier supply system (the first modifier supply system and the second modifier supply system) may also be referred to as an inhibitor supply system (first inhibitor supply system and second inhibitor supply system). Since the O- and H-containing substance acts as an oxidizing agent (an oxidizing gas), the O- and H-containing substance supply system may also be referred to as an oxidizing agent (oxidizing gas) supply system. When the oxidizing agent (the oxidizing gas) is used as the reaction gas, the reaction gas supply system may be also referred to as an oxidizing agent (an oxidizing gas) supply system. Since the precursor gas, the reaction gas, and the catalyst gas act as a film-forming gas, the precursor gas supply system, the reaction gas supply system, and the catalyst gas supply system may also be referred to as a film-forming gas supply system.

One or all of the above-described various supply systems may be configured as an integrated-type supply system 248 in which the valves 243a to 243h, the MFCs 241a to 241h, and so on are integrated. The integrated-type supply system 248 is connected to each of the gas supply pipes 232a to 232h. In addition, the integrated-type supply system 248 is configured such that operations of supplying various gases into the gas supply pipes 232a to 232h, that is, opening/closing operations of the valves 243a to 243h, flow rate regulation operations by the MFCs 241a to 241h, and the like) are controlled by a controller 121 to be described below. The integrated-type supply system 248 is configured as an integral type or detachable-type integrated unit, and may be attached to and detached from the gas supply pipes 232a to 232h and the like on an integrated unit basis, such that maintenance, replacement, extension, and the like of the integrated-type supply system 248 may be performed on an integrated unit basis.

The exhaust port 231a configured to exhaust an internal atmosphere of the process chamber 201 is provided below the sidewall of the reaction tube 203. As shown in FIG. 4, in a plane view, the exhaust port 231a is provided at a position opposing (facing) the nozzles 249a to 249c (the gas supply holes 250a to 250c) with the wafers 200 interposed therebetween. The exhaust port 231a may be provided from a lower portion to an upper portion of the sidewall of the reaction tube 203, that is, along the wafer arrangement region. An exhaust pipe 231 is connected to the exhaust port 231a. The exhaust pipe 231 is made of, for example, a metal material such as SUS. A vacuum exhaust device, for example, a vacuum pump 246, is connected to the exhaust pipe 231 via a pressure sensor 245, which is a pressure detector (pressure detecting part) configured to detect the internal pressure of the process chamber 201, and an auto pressure controller (APC) valve 244, which is a pressure regulator (pressure regulation part). The APC valve 244 is configured to perform or stop a vacuum exhausting operation in the process chamber 201 by opening/closing the valve while the vacuum pump 246 is actuated, and is also configured to regulate the internal pressure of the process chamber 201 by adjusting an opening state of the valve based on pressure information detected by the pressure sensor 245 while the vacuum pump 246 is actuated. An exhaust system mainly includes the exhaust pipe 231, the APC valve 244, and the pressure sensor 245. The exhaust system may include the vacuum pump 246.

A seal cap 219, which serves as a furnace opening lid configured to hermetically seal a lower end opening of the manifold 209, is installed under the manifold 209. The seal cap 219 is made of, for example, a metal material such as SUS, and is formed in a disc shape. An O-ring 220b, which is a seal making contact with the lower end of the manifold 209, is installed on an upper surface of the seal cap 219. A rotation mechanism 267 configured to rotate a boat 217 to be described below, is installed under the seal cap 219. A rotary shaft 255 of the rotation mechanism 267 is made of, for example, a metal material such as SUS and is connected to the boat 217 via the seal cap 219. The rotation mechanism 267 is configured to rotate the wafers 200 by rotating the boat 217. The seal cap 219 is configured to be vertically raised or lowered by a boat elevator 115 which is an elevating mechanism installed outside the reaction tube 203. The boat elevator 115 is configured as a transfer device (transfer mechanism) which loads/unloads (transfers) the wafers 200 into/out of the process chamber 201 by raising or lowering the seal cap 219. A shutter 219s, which serves as a furnace opening lid configured to hermetically seal a lower end opening of the manifold 209 in a state where the seal cap 219 is lowered and the boat 217 is unloaded from the process chamber 201, is installed under the manifold 209. The shutter 219s is made of, for example, a metal material such as SUS and is formed in a disc shape. An O-ring 220c, which is a seal making contact with the lower end of the manifold 209, is installed on an upper surface of the shutter 219s. The opening/closing operation (such as elevation operation, rotation operation, or the like) of the shutter 219s is controlled by a shutter opening/closing mechanism 115s.

The boat 217 serving as a substrate support is configured to support a plurality of wafers 200, for example, 25 to 200 wafers, in such a state that the wafers 200 are arranged in a horizontal posture and in multiple stages along a vertical direction with the centers of the wafers 200 aligned with one another. As such, the boat 217 is configured to arrange the wafers 200 to be spaced apart from each other. The boat 217 is made of a heat resistant material such as quartz or SiC. Heat insulating plates 218 made of a heat resistant material such as quartz or SiC are installed below the boat 217 in multiple stages.

A temperature sensor 263 serving as a temperature detector is installed in the reaction tube 203. Based on temperature information detected by the temperature sensor 263, a state of supplying electric power to the heater 207 is regulated such that an interior of the process chamber 201 has a desired temperature distribution. The temperature sensor 263 is installed along the inner wall of the reaction tube 203.

Figure 5:
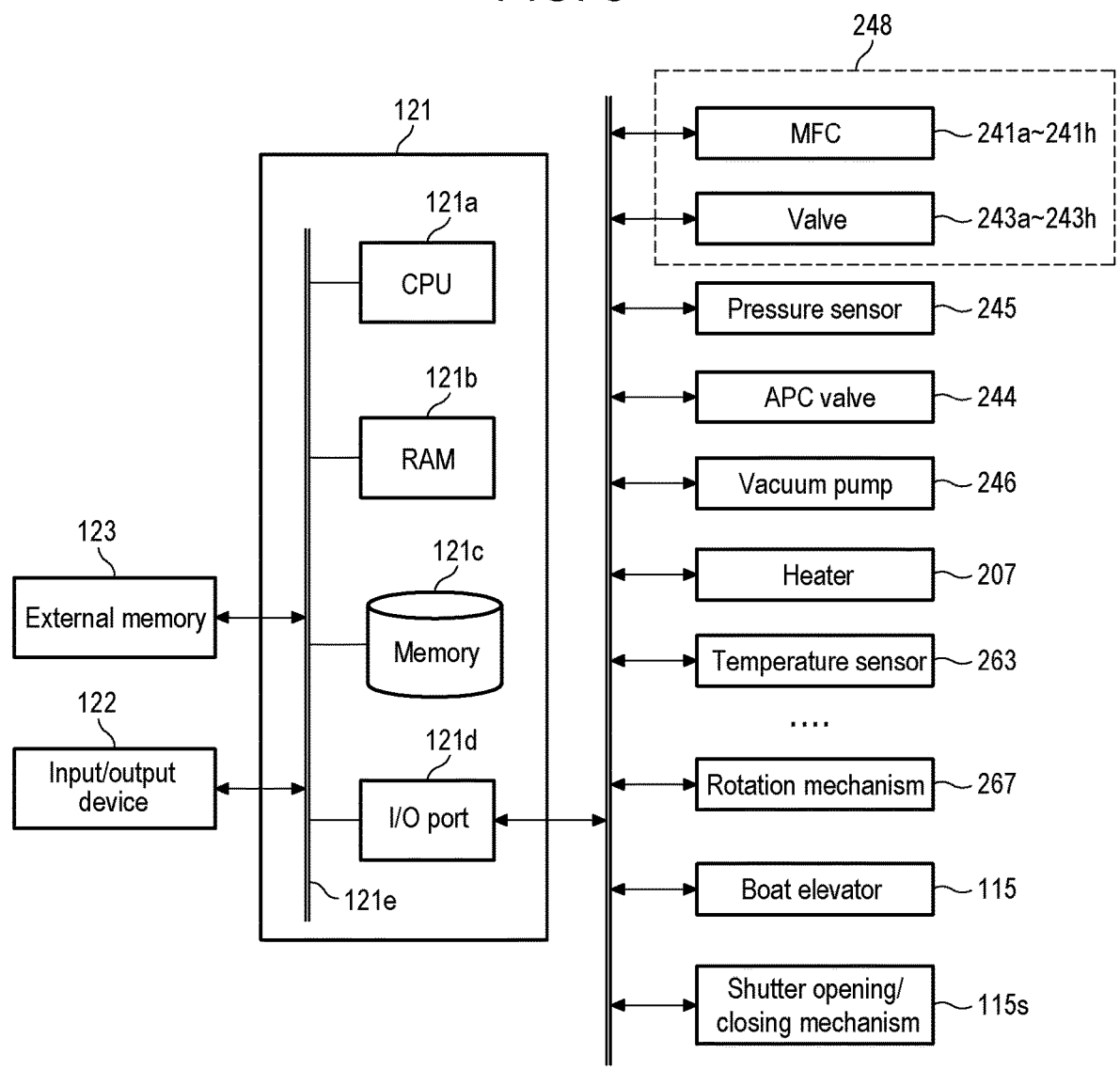
FIG. 5 is a schematic configuration diagram of a controller 121 of a substrate processing apparatus suitably used in embodiments of the present disclosure, in which a control system of the controller 121 is shown in a block diagram.

As shown in FIG. 5, the controller 121, which is a control part (control means), may be configured as a computer including a central processing unit (CPU) 121a, a random access memory (RAM) 121b, a memory 121c, and an I/O port 121d. The RAM 121b, the memory 121c, and the I/O port 121d are configured to be capable of exchanging data with the CPU 121a via an internal bus 121e. An input/output device 122 formed of, for example, a touch panel or the like, is connected to the controller 121.

The memory 121c includes, for example, a flash memory, a hard disk drive (HDD), a solid state drive (SSD), or the like. A control program that controls operations of a substrate processing apparatus, a process recipe in which sequences and conditions of substrate processing to be described below are written, and the like are readably stored in the memory 121c. The process recipe functions as a program that causes, by the controller 121, the substrate processing apparatus to execute each sequence in the substrate processing to be described below, to obtain an expected result. Hereinafter, the process recipe, the control program, and the like may be generally and simply referred to as a "program." Furthermore, the process recipe may be simply referred to as a "recipe." When the term "program" is used herein, it may indicate a case of including the recipe solely, a case of including the control program solely, or a case of including both the recipe and the control program. The RAM 121b is configured as a memory area (work area) in which a program or data read by the CPU 121a is temporarily stored.

The I/O port 121d is connected to the above-described MFCs 241a to 241h, the valves 243a to 243h, the pressure sensor 245, the APC valve 244, the vacuum pump 246, the temperature sensor 263, the heater 207, the rotation mechanism 267, the boat elevator 115, the shutter opening/closing mechanism 115s, and so on.

The CPU 121a is configured to be capable of reading and executing the control program from the memory 121c. The CPU 121a is also configured to be capable of reading the recipe from the memory 121c according to an input of an operation command from the input/output device 122. The CPU 121a is configured to be capable of controlling the flow rate regulating operation of various kinds of gases by the MFCs 241a to 241h, the opening/closing operation of the valves 243a to 243h, the pressure regulating operation performed by the APC valve 244 based on the opening/closing operation of the APC valve 244 and the pressure sensor 245, the actuating and stopping operation of the vacuum pump 246, the temperature regulating operation performed by the heater 207 based on the temperature sensor 263, the operation of rotating the boat 217 and adjusting the rotation speed of the boat 217 by the rotation mechanism 267, the operation of raising or lowering the boat 217 by the boat elevator 115, the opening/closing operation of the shutter 219s by the shutter opening/closing mechanism 115s, and so on, according to contents of the read recipe.

The controller 121 may be configured by installing, on the computer, the aforementioned program stored in an external memory 123. Examples of the external memory 123 may include a magnetic disk such as a HDD, an optical disc such as a CD, a magneto-optical disc such as an MO, a semiconductor memory such as a USB memory or a SSD, and the like. The memory 121c or the external memory 123 is configured as a computer-readable recording medium. Hereinafter, the memory 121c and the external memory 123 may be generally and simply referred to as a "recording medium." When the term "recording medium" is used herein, it may indicate a case of including the memory 121c solely, a case of including the external memory 123 solely, or a case of including both the memory 121c and the external memory 123. Furthermore, the program may be provided to the computer by using communication means such as the Internet or a dedicated line, instead of using the external memory 123.

(2) Substrate Processing Process

As a process of manufacturing a semiconductor device by using the above-described substrate processing apparatus, an example of a processing sequence (a gas supply sequence) of selectively forming a film on the surface of a second base of a first base and the second base exposed on the surface of a wafer 200 as a substrate will be described mainly with reference to FIGS. 6, 7A to 7D, and 8A to 8D. In the following description, operations of the respective parts constituting the substrate processing apparatus are controlled by the controller 121.

Figure 6:
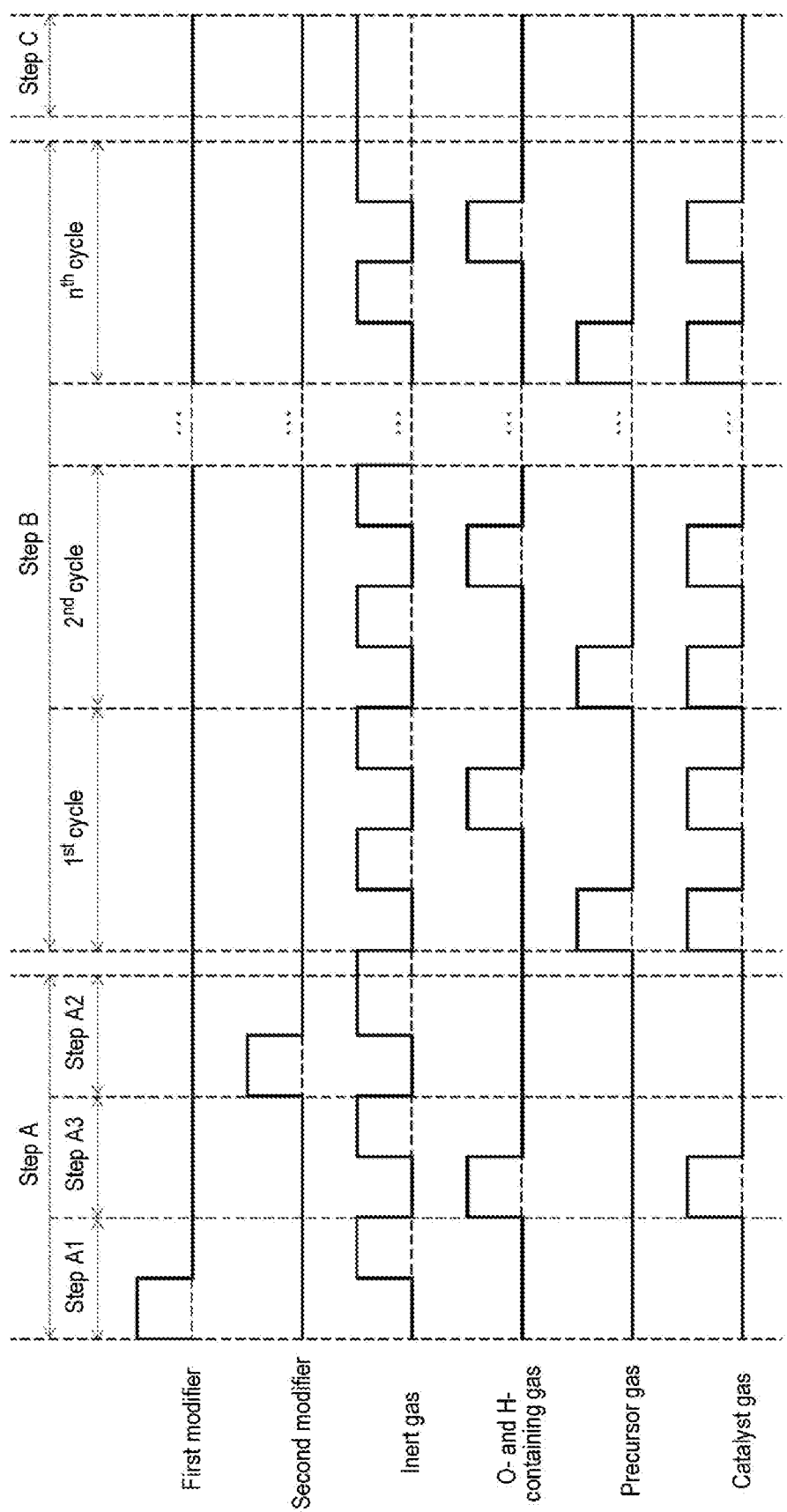
FIG. 6 is a diagram showing an example of a processing sequence in selective growth of embodiments of the present disclosure.

A processing sequence shown in FIG. 6 includes:
(a) Step A of modifying a surface of a first base of a wafer 200 by supplying a first modifier and a second modifier to a wafer 200 having a surface on which the first base and a second base are exposed; and
(b) Step B of selectively forming a film on a surface of the second base by supplying a film-forming gas to the wafer 200 after modifying the surface of the first base.

Here, the first modifier contains one or more atoms to which a first functional group and a second functional group are directly bonded. Further, the second modifier contains an atom to which the first functional group and the second functional group are directly bonded, and the number of first functional groups contained in one molecule of the second modifier is less than the number of first functional groups contained in one molecule of the first modifier. The film-forming gas includes a precursor gas, a reaction gas, and a catalyst gas.

In the processing sequence shown in FIG. 6, Step A includes Step A1 of supplying the first modifier to the wafer 200 and Step A2 of supplying the second modifier to the wafer 200, which are performed non-simultaneously and in this order. Further, Step A includes Step A3 of supplying an O- and H-containing substance to the wafer 200. In Step A, Step A1, Step A3, and Step A2 are performed in this order.

Further, in the processing sequence shown in FIG. 6, Step B includes performing a cycle a predetermined number of times (n times, where n is an integer of 1 or more), the cycle including non-simultaneously performing Step B1 of supplying a precursor gas and a catalyst gas to the wafer 200 and Step B2 of supplying a reaction gas and a catalyst gas to the wafer 200. FIG. 6 shows an example in which, for example, an O- and H-containing substance is used as the reaction gas.

Further, in the processing sequence shown in FIG. 6, as post-treatment for the wafer 200 after selective growth, Step C of heating the wafer 200 after the film is selectively formed on the surface of the second base is performed. Step C may not have to be performed and may be omitted.

In the present disclosure, for the sake of convenience, the above-described processing sequence may be denoted as follows. The same denotation may be used in other embodiments and modifications to be described below.

First modifier→O- and H-containing substance→Second modifier→(Precursor gas+Catalyst gas→Reaction gas+Catalyst gas)×n→Post-treatment Further, since FIG. 6 shows an example in which, for example, the O- and H-containing substance is used as the reaction gas, the processing sequence shown in FIG. 6 may also be denoted as follows.

First modifier→O- and H-containing substance→Second modifier→(Precursor gas+Catalyst gas→O- and H-containing substance+Catalyst gas)×n→Post-treatment When the term "wafer" is used in the present disclosure, it may refer to "a wafer itself" or "a wafer and a stacked body of certain layers or films formed on a surface of the wafer." When the phrase "a surface of a wafer" is used in the present disclosure, it may refer to "a surface of a wafer itself" or "a surface of a certain layer and the like formed on a wafer." When the expression "a certain layer is formed on a wafer" is used in the present disclosure, it may mean that "a certain layer is formed directly on a surface of a wafer itself" or that "a certain layer is formed on a layer and the like formed on a wafer." When the term "substrate" is used in the present disclosure, it may be synonymous with the term "wafer."

(Wafer Charging and Boat Loading)

After the boat 217 is charged with a plurality of wafers 200 (wafer charging), the shutter 219s is moved by the shutter opening/closing mechanism 115s such that the lower end opening of the manifold 209 is opened (shutter open). Thereafter, as shown in FIG. 3, the boat 217 holding the plurality of wafers 200 is lifted up by the boat elevator 115 to be loaded into the process chamber 201 (boat loading). In this state, the seal cap 219 seals the lower end of the manifold 209 via the O-ring 220b.

Figure 8A:
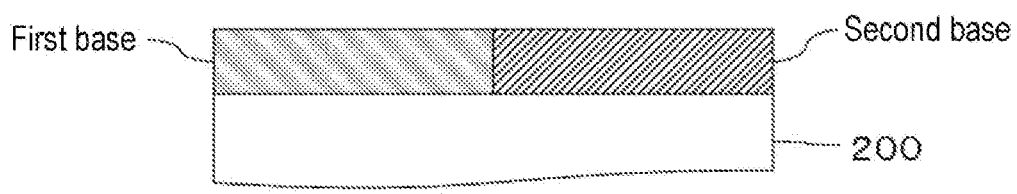
FIGS. 8A to 8D are partially-enlarged cross-sectional views of the surface of a wafer 200 at each step in selective growth of embodiments of the present disclosure.

As shown in FIG. 8A, the first base and the second base are exposed on the surface of the wafer 200 charged in the boat 217. The surface of the first base in the wafer 200 contains an OH termination which is an adsorption site over the entire area (entire surface). That is, the surface of the first base in the wafer 200 has a surface terminated with an OH group over the entire area (entire surface). On the other hand, the surface of the second base in the wafer 200 has a surface having many regions not terminated with the OH group.

(Pressure Regulation and Temperature Regulation)

Thereafter, the interior of the process chamber 201, that is, a space where the wafers 200 are placed, is vacuum-exhausted (decompression-exhausted) by the vacuum pump 246 to reach a desired pressure (degree of vacuum). At this time, the internal pressure of the process chamber 201 is measured by the pressure sensor 245, and the APC valve 244 is feedback-controlled based on the measured pressure information. Further, the wafers 200 in the process chamber 201 are heated by the heater 207 to have a desired processing temperature. At this time, a state of supplying electric power to the heater 207 is feedback-controlled based on the temperature information detected by the temperature sensor 263 such that the interior of the process chamber 201 has a desired temperature distribution. Further, the rotation of the wafers 200 by the rotation mechanism 267 is started. The exhaust of the interior of the process chamber 201 and the heating and rotation of the wafers 200 are continuously performed at least until the processing on the wafers 200 is completed.

(Step A)

Thereafter, the above-described Steps A1, Step A3, and Step A2 are performed in this order. Each of these steps will be described below.

(Step A1)

In Step A1, the first modifier is supplied to the wafer 200 in the process chamber 201, that is, the wafer 200 having the surface on which the first base and the second base are exposed.

Specifically, the valve 243a is opened to allow the first modifier to flow into the gas supply pipe 232a. A flow rate of the first modifier is regulated by the MFC 241a, and the first modifier is supplied into the process chamber 201 via the nozzle 249a and is exhausted via the exhaust port 231a. In this operation, the first modifier is supplied to the wafer 200. At this time, the valves 243e to 243g may be opened to allow an inert gas to be supplied into the process chamber 201 via the nozzles 249a to 249c, respectively.

By supplying the first modifier to the wafer 200 under process conditions to be described below, it is possible to selectively (preferentially) modify the surface of the first base. Specifically, in Step A1, it is possible to modify the surface of the first base by selectively (preferentially) chemically adsorbing the first modifier on the surface of the first base in the wafer 200 by using a chemical reaction between the OH termination on the surface of the first base and the first modifier. At this time, one or more selected from the group of two or more first functional groups of the first modifier are desorbed by the chemical reaction with the OH termination, and residues derived from the first modifier containing the second functional group are present on the surface of the first base. In addition, some of the residues derived from the first modifier present on the surface of the first base contain the first functional group that was not used in the chemical reaction with the OH termination. Therefore, a first modified layer by the residues derived from the first modifier in a state where the first modified layer contains the first functional group and the second functional group (specifically, for example, a first modified layer 10 shown in FIG. 7B to be described below) is formed on the surface of the first base modified by the first modifier. Here, the second functional group contained in the first modified layer is a chemically stable functional group.

After the surface of the first base is modified with the first modifier, the valve 243a is closed to stop the supply of the first modifier into the process chamber 201. Then, the interior of the process chamber 201 is vacuum-exhausted to remove the first modifier and the like remaining in the process chamber 201 from the process chamber 201. At this time, the valves 243e to 243g are opened to allow an inert gas to be supplied into the process chamber 201 via the nozzles 249a to 249c. The inert gas supplied from the nozzles 249a to 249c acts as a purge gas, whereby the interior of the process chamber 201 is purged (purging).

In Step A1, a process condition under which the first modifier is supplied may be a condition where the first modifier itself does not undergo thermal decomposition (gas phase decomposition), and specifically may be exemplified as follows.

Processing temperature: room temperature (25 degrees C.) to 500 degrees C., specifically 50 to 300 degrees C.
Processing pressure: 1 to 13,300 Pa, specifically 50 to 1,330 Pa
First modifier supply flow rate: 1 to 3,000 sccm, specifically 50 to 1,000 sccm
First modifier supply time: 0.1 second to 120 minutes, specifically 30 seconds to 60 minutes
Inert gas supply flow rate (for each gas supply pipe): 0 to 20,000 sccm In Step A1, a process condition under which the purging is performed is exemplified as follows.

Processing temperature: room temperature (25 degrees C.) to 500 degrees C., specifically 50 to 300 degrees C.
Processing pressure: 1 to 400 Pa
Inert gas supply flow rate (for each gas supply pipe): 50 to 20,000 sccm
Inert gas supply time: 10 to 120 seconds In the present disclosure, a notation of a numerical range such as "1 to 13,300 Pa" means that a lower limit value and an upper limit value are included in the range. Therefore, for example, "1 to 13,300 Pa" means "1 Pa or higher and 13,300 Pa or lower." The same applies to other numerical ranges. The processing temperature means the temperature of the wafer 200, and the processing pressure means the internal pressure of the process chamber 201. Further, the gas supply flow rate: 0sccm means a case where the gas is not supplied. The same applies to the following description.

In Step A1, the first modifier may be chemically adsorbed on a portion of the surface of the second base. However, the amount of chemical adsorption of the first modifier on the surface of the second base is small, and the amount of chemical adsorption of the first modifier on the surface of the first base is overwhelmingly large. In this way, a significant difference between the amount of chemical adsorption of the first modifier on the surface of the second base and the amount of chemical adsorption of the first modifier on the surface of the first base is because, as described above, in the wafer 200, the surface of the first base contains the OH termination over the entire area, whereas many regions of the surface of the second base do not contain the OH termination. It is also because the process condition in Step A1 is the condition in which the first modifier does not undergo thermal decomposition (gas phase decomposition) in the process chamber 201.

(Step A3)

After Step A1 is completed, Step A3 is performed. In Step A3, an O- and H-containing substance is supplied to the wafer 200 in the process chamber 201 after the completion of Step A1, that is, the wafer 200 in which the first modified layer is formed on the surface of the first base. When supplying the O- and H-containing substance to the wafer 200, a catalyst gas may be supplied together, as shown in FIG. 6. This makes it possible to promote a chemical reaction to be described below, thereby shortening the processing time in Step A3. However, depending on the process conditions, the supply of the catalyst gas may not have to be performed and may be omitted. Hereinafter, an example in which the catalyst gas is used in combination will be described.

Specifically, the valves 243c and 243d are opened to allow the O- and H-containing substance to flow through the gas supply pipe 232c and the catalyst gas to flow through the gas supply pipe 232d, respectively. The flow rates of the O- and H-containing substance and the catalyst gas are regulated by the MFCs 241c and 241d, respectively, and the O- and H-containing substance and the catalyst gas are supplied into the process chamber 201 via the nozzles 249c and 249a, are mixed after being supplied into the process chamber 201, and are exhausted via the exhaust port 231a. In this operation, the O- and H-containing substance and the catalyst gas are supplied to the wafer 200. At this time, the valves 243e to 243g may be opened to allow an inert gas to be supplied through the process chamber 201 via the nozzles 249a to 249c, respectively.

By supplying the O- and H-containing substance and the catalyst gas to the wafer 200 under process conditions to be described below, it is possible to form an OH termination in the first modified layer formed in Step A1. That is, in Step A3, the first functional group in the residues derived from the first modifier contained in the first modified layer formed on the surface of the first base chemically reacts with the O- and H-containing substance to substitute the first functional group contained in the first modified layer with the OH group. At this time, the second functional group contained in the first modified layer does not contribute to the above-described chemical reaction and is maintained as it is. Therefore, when the O- and H-containing substance and the catalyst gas are supplied, the OH termination is formed in the first modified layer, such that the first modified layer is changed to a second modified layer containing the OH termination (specifically, for example, a second modified layer 20 shown in FIG. 7C to be described below). The second functional group in the residues derived from the first modifier is contained in the second modified layer, as it is.

In Step A3, a reaction by which the first functional group contained in the first modified layer is substituted with the OH group may have to occur, and it is possible to progress the above-described reaction under a non-plasma atmosphere and under a low temperature condition as described below. In this way, by performing Step A3 under the non-plasma atmosphere and under the low temperature condition as described below, in the process of changing the first modified layer to the second modified layer, it is possible to prevent the first modified layer (the residues derived from the first modifier) from being desorbed and removed from the surface of the first base.

After the first modified layer formed on the surface of the first base is changed to the second modified layer, the valves 243c and 243d are closed to stop of the supply of the O- and H-containing substance and the catalyst gas into the process chamber 201, respectively. Then, a gas and the like remaining in the process chamber 201 are removed from the process chamber 201 (purging) according to the same processing procedure and process conditions as those in the above-described Step A1.

In Step A3, a process condition under which the O- and H-containing substance is supplied is exemplified as follows.

Processing temperature: room temperature (25 degrees C.) to 500 degrees C., specifically room temperature to 300 degrees C.

Processing pressure: 1 to 101,325 Pa

O- and H-containing substance supply flow rate: 10 to 10,000 sccm

O- and H-containing substance supply time: 1 second to 24 hours

Inert gas supply flow rate (for each gas supply pipe): 0 to 20,000 sccm (Step A2)

After Step A3 is completed, Step A2 is performed. In Step A2, a second modifier is supplied to the wafer 200 in the process chamber 201 after the completion of Step A3, that is, the wafer 200 including the second modified layer formed on the surface of the first base.

Specifically, the valve 243h is opened to allow the second modifier to flow through the gas supply pipe 232h. The flow rate of the second modifier is regulated by the MFC 241h, and the second modifier is supplied into the process chamber 201 via the gas supply pipe 232a and the nozzle 249a and is exhausted via the exhaust port 231a. In this operation, the second modifier is supplied to the wafer 200. At this time, the valves 243e to 243g may be opened to allow an inert gas to be supplied into the process chamber 201 via the nozzles 249a to 249c, respectively.

Figure 7D:
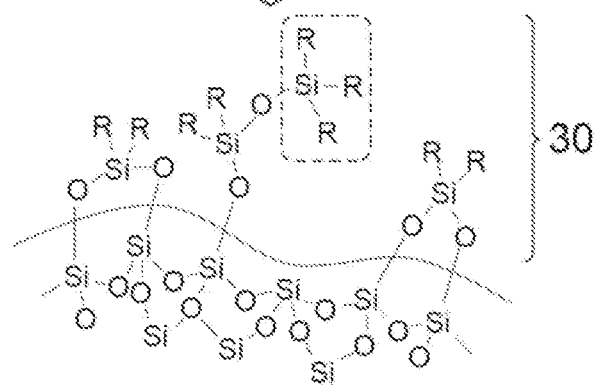
FIG. 7D is a schematic view showing a chemical structure formed by supplying (dialkylamino)trialkylsilane to the surface of the SiO film shown in FIG. 7C.
Figure 8B:
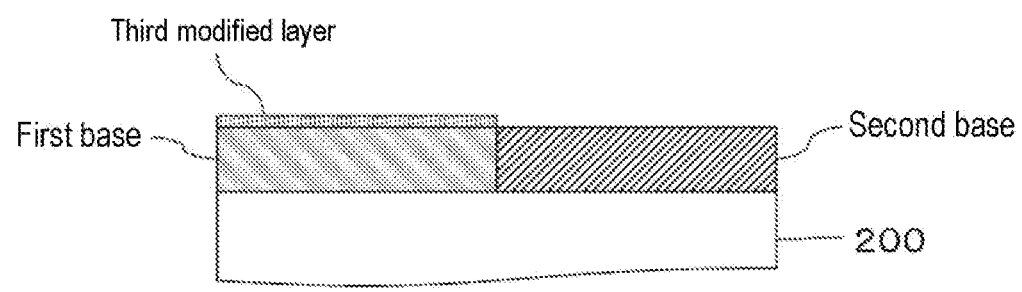

By supplying the second modifier to the wafer 200 under process conditions to be described below, it is possible to chemically adsorb the second modifier on the OH termination of the second modified layer formed on the surface of the first base. That is, in Step A2, by selectively (preferentially) chemically adsorbing the second modifier on the surface of the first base on the wafer 200, specifically, the surface of the second modified layer, by using a chemical reaction between the OH termination of the second modified layer and the second modifier, it is possible to further modify the surface of the first base. At this time, the first functional group contained in the second modifier is desorbed by the chemical reaction with the OH termination contained in the second modifier, and the residues derived from the second modifier containing the second functional group is present on the surface of the first base, specifically, the surface of the second modified layer, that is, the outermost surface of the first base. Since the number of first functional groups contained in one molecule of the second modifier is smaller than that of the first modifier, most of the first functional groups contained in the second modifier are used in the chemical reaction with OH termination contained in the second modified layer. Therefore, a third modified layer containing the residues derived from the first modifier in a state where the third modified layer contains the second functional group and the residues derived from the second modifier in a state where the third modified layer contains the second functional group (specifically, for example, a third modified layer 30 shown in FIG. 7D to be described below) is formed on the outermost surface of the first base further modified with the second modifier. Thus, the third modified layer contains no remaining first functional group or a small amount of remaining first functional group. Here, FIG. 8B shows a state where the third modified layer is formed on the surface of the first base exposed on the surface of the wafer 200.

After the surface of the first base is further modified with the second modifier, the valve 243h is closed to stop the supply of the second modifier into the process chamber 201. Then, a gas and the like remaining in the process chamber 201 is removed from the process chamber 201 (purging) according to the same processing procedure and process conditions as those in the purging at the above-described Step A1.

In Step A2, a process condition under which the second modifier is supplied may be a conditions where the second modifier itself does not undergo thermal decomposition (gas phase decomposition), and specifically may be exemplified as follows.

Processing temperature: room temperature (25 degrees C.) to 500 degrees C., specifically 50 to 300 degrees C.

Processing pressure: 1 to 13,300 Pa, specifically 50 to 1,330 Pa

Second modifier supply flow rate: 1 to 3,000 sccm, specifically 50 to 1,000 sccm Second modifier supply time: 0.1 second to 120 minutes, specifically 30 seconds to 60 minutes Inert gas supply flow rate (for each gas supply pipe): 0 to 20,000 sccm —First Modifier and Second Modifier—

Here, the first modifier used in Step A1 and the second modifier used in Step A2 will be described. Both the first modifier and the second modifier contain one or more atoms to which the first functional group and the second functional group are directly bonded.

First Modifier

The first functional group in the first modifier may be a functional group that allows chemical adsorption of the first modifier on an adsorption site (for example, the OH termination) on the surface of the first base. The first functional group may include an amino group, and specifically may include a substituted amino group. When the first modifier contains an amino group (specifically a substituted amino group), it is possible to increase the amount of chemical adsorption of the first modifier on the surface of the first base. In particular, from the viewpoint of adsorbability on the first base, all the first functional groups of the first modifier may be substituted amino groups.

A substituent of the substituted amino group may be an alkyl group, specifically an alkyl group containing 1 to 5 carbon atoms, or more specifically an alkyl group containing 1 to 4 carbon atoms. The alkyl group of the substituted amino group may be linear or branched. Specific examples of the alkyl group of the substituted amino group may include a methyl group, an ethyl group, an n-propyl group, an n-butyl group, an isopropyl group, an isobutyl group, a sec-butyl group, a tert-butyl group, and the like.

The number of substituents of the substituted amino group is 1 or 2, specifically 2. When the number of substituents of the substituted amino group is 2, the two substituents may be the same or different.

The number of first functional groups in the first modifier may be larger than the number of first functional groups contained in one molecule of the second modifier to be described below. Specifically, the number of first functional groups in the first modifier may be an integer of 2 or more, and may be an integer of valence-1 or less of an atom to which the first functional group and the second functional group are directly bonded. From the viewpoint of availability of the first modifier and the like, the number of first functional groups in the first modifier may be 2 specifically. A plurality of first functional groups contained in the first modifier may be the same or different.

The second functional group in the first modifier may be a functional group capable of modifying the surface of the first base into a film formation inhibition region. The second functional group may be a chemically stable functional group specifically, or more specifically a hydrocarbon group. The hydrocarbon group may be an aliphatic hydrocarbon group such as an alkyl group, an alkenyl group, or an alkynyl group, or an aromatic hydrocarbon group. Of these, an alkyl group may be used as the hydrocarbon group specifically. In particular, from the viewpoint of high chemical stability and availability, all the second functional groups of the first modifier may be alkyl groups specifically.

The alkyl group as the second functional group may be an alkyl group containing 1 to 5 carbon atoms specifically, or more specifically an alkyl group containing 1 to 4 carbon atoms. The alkyl group of the substituted amino group may be linear or branched. Specific examples of the alkyl group of the substituted amino group may include a methyl group, an ethyl group, an n-propyl group, an n-butyl group, an isopropyl group, an isobutyl group, a sec-butyl group, a tert-butyl group, and the like.

The number of second functional groups in the first modifier is an integer of 1 or more, and may be an integer equal to or less than (valence of an atom to which the first functional group and the second functional group are directly bonded)-(the number of first functional groups in the first modifier). When the number of first functional groups in the first modifier is 2, the number of second functional groups in the first modifier may be 2. A plurality of second functional groups contained in the first modifier may be the same or different.

In the first modifier, examples of the atom to which the first functional group and the second functional group are directly bonded may include a carbon (C) atom, a silicon (Si) atom, a germanium (Ge) atom, a tetravalent metal atom, and the like. Here, examples of the tetravalent metal atom may include a titanium (Ti) atom, a zirconium (Zr) atom, a hafnium (Hf) atom, a molybdenum (Mo) atom, a tungsten (W) atom, and the like. The atom to which the first functional group and the second functional group are directly bonded may be a metal atom capable of bonding to four or more ligands, in addition to the tetravalent metal atom. In this case, the number of second functional groups may be increased, which may exhibit a strong effect as an inhibitor.

Among the above-described atoms, specifically, the C atom, the Si atom, and the Ge atom may be the atom to which the first functional group and the second functional group are directly bonded. This is because when any of the C atom, Si atom, and Ge atom is used as the atom to which the first functional group and the second functional group are directly bonded, it is possible to obtain at least one selected from the group of the high adsorbability of the first modifier on the surface of the first base and the high chemical stability of the first modifier after being adsorbed on the surface of the first base, that is, the residues derived from the first modifier. Among the above-described atoms, more specifically, the Si atom may be the atom to which the first functional group and the second functional group are directly bonded. This is because when the Si atom is used as the atom to which the first functional group and the second functional group are directly bonded, it is possible to obtain both the high adsorbability of the first modifier on the surface of the first base and the high chemical stability of the first modifier after being adsorbed on the surface of the first base, that is, the residues derived from the first modifier, in a well-balanced manner. As described above, the first functional group and the second functional group are directly bonded to the atom to which the first functional group and the second functional group are directly bonded, but in addition to the first functional group and the second functional group, a hydrogen (H) atom or a third functional group may be bonded to the atom.

The third functional group bonded to the atom to which the first functional group and the second functional group are directly bonded may be a functional group other than the functional groups described above as the first functional group and the second functional group. Examples of the third functional group may include functional groups formed by appropriately combining two or more selected from the group of a C atom, a Si atom, a Ge atom, a tetravalent metal atom, a metal atom capable of bonding to four or more ligands, an O atom, a nitrogen (N) atom, and a H atom.

The first modifier contains one or more atoms to which the first functional group and the second functional group are directly bonded, but may contain two or more atoms to which the first functional group and the second functional group are directly bonded. Hereinafter, the atom to which the first functional group and the second functional group are directly bonded is also referred to as an atom Y for the sake of convenience. The two or more atoms Y may be directly bonded or may be bonded via a linking group. The number of atoms Y in the first modifier may be an integer of 1 or more, or may be, for example, 1, 2, 3, or more. Among these numbers, the number of atoms Y in the first modifier may be specifically 1 or 2, more specifically 1.

In the first modifier, when the number of atoms Y in a molecule is 2, examples of the linking group that bonds the two atoms Y together may include —$C_nH_{2n}$—, —O—, and —NR"—. Here, n in —$C_nH_{2n}$— represents an integer of 1 or more. Further, an example of R" in —NR"— may include a H atom or an alkyl group. Among these linking group, specifically, —$C_nH_{2n}$— may be the linking group that bonds the two atoms Y together, and n in —$C_nH_{2n}$— may be specifically 1 to 5, or more specifically 1 or 2.

The first modifier may have structures containing one or more tetravalent atoms to which the first functional group and the second functional group are directly bonded. Among the structures, specifically, the first modifier may have a structure containing one or more Si's to which the first functional group and the second functional group are directly bonded. More specifically, the first modifier may have a structure containing one or two Si's to which the first functional group and the second functional group are directly bonded. When the first modifier has a structure containing two Si's to which the first functional group and the second functional group are directly bonded, the two Si's may be bonded directly or via the above-described linking group. When the first modifier has the structure containing the two Si's to which the first functional group and the second functional group are directly bonded, the first functional group, the second functional group, and the above-described linking group may be directly bonded to the two Si's. Further, among the above-described structures, more specifically, the first modifier may have the structure containing one Si to which the first functional group and the second functional group are directly bonded. That is, more specifically, the first modifier may have the structure containing Si as the center atom to which the first functional group and the second functional group are directly bonded.

The first modifier may have structures containing two amino groups in one molecule. Among the structures, specifically, the first modifier may have structures containing two amino groups and at least one alkyl group in one molecule. Among the structures, the first modifier may have structures containing two amino groups and two alkyl groups in one molecule.

Further, specifically, the first modifier may have structures containing Si, which is the center atom, to which two amino groups are bonded. Among the structures, more specifically, the first modifier may have structures containing Si, which is the center atom, to which two amino groups and at least one alkyl group are bonded. Among the structures, more specifically, the first modifier may have a structure containing Si, which is the center atom, to which two amino groups and two alkyl groups are bonded.

Further, as described above, the amino group may be the substituted amino group. The substituent of the substituted amino group is as described above.

As the first modifier, for example, a compound represented by the following formula (1) may be used.

Formula (1)

In Formula (1), $R^1$ represents the first functional group that directly bonds to X, $R^2$ represents the second functional group or H atom that directly bond to X, X represents a tetravalent atom selected from the group of a C atom, a Si atom, a Ge atom, and tetravalent metal atoms, $n^1$ represents 2 or 3, and $m^1$ represents 1 or 2.

The first functional group represented by $R^1$ has the same meaning as the above-mentioned first functional group, and also has the same examples. When $n^1$ is 2 or 3, two or three $R^1$'s, that is, two or three first functional groups, may be the same or different. The second functional group represented by $R^2$ has the same meaning as the above-mentioned second functional group, and also has the same examples. When $m^1$ is 2, one of two $R^2$'s may be a H atom and the other may be a second functional group, or both may be a second functional group. When both of the two $R^2$'s are the second functional group, the two second functional groups may be the same or different.

A Si atom may be the tetravalent atom represented by X.

$n^1$ may be 2.

$m^1$ may be 2.

As the first modifier, it may be possible to use, for example, bis(dimethylamino)dimethylsilane ($[(CH_3)_2N]_2Si(CH_3)_2$, abbreviation: BDMADMS), bis(diethylamino)diethylsilane ($[(C_2H_5)_2N]_2Si(C_2H_5)_2$, abbreviation: BDEADES), bis(dimethylamino)diethylsilane ($[(CH_3)_2N]_2Si(C_2H_5)_2$, abbreviation: BDMADES), bis(diethylamino)dimethylsilane ($[(C_2H_5)_2N]_2Si(CH_3)_2$, abbreviation: BDEADMS), bis(dimethylamino)silane ($[(CH_3)_2N]_2SiH_2$, abbreviation: BDMAS), bis(dimethylaminodimethylsilyl)ethane ($[(CH_3)_2N(CH_3)_2Si]_2C_2H_6$, abbreviation: BDMADMSE), bis(dipropylamino)silane ($[(C_3H_7)_2N]_2SiH_2$, abbreviation: BDPAS), bis(dipropylamino)dimethylsilane ($[(C_3H_7)_2N]_2Si(CH_3)_2$, abbreviation: BDPADMS) bis(dipropylamino)diethylsilane ($(C_3H_7)_2N]_2Si(C_2H_5)_2$, abbreviation: BDPADES), (dimethylsilyl)diamine ($(CH_3)_2Si(NH_2)_2$, abbreviation: DMSDA), (diethylsilyl)diamine ($(C_2H_5)_2Si(NH_2)_2$, abbreviation: DESDA), (dipropylsilyl)diamine ($(C_3H_7)_2Si(NH_2)_2$, abbreviation: DPSDA bis(dimethylaminodimethylsilyl)methane ($[(CH_3)_2N(CH_3)_2Si]_2CH_2$, abbreviation: BDMADMSM, bis(dimethylamino)tetramethyldisilane ($[(CH_3)_2N]_2(CH_3)_4Si_2$, abbreviation: BDMATMDS), or the like. As the first modifier, one or more selected from the group of the above-described substances may be used.

Second Modifier

The first functional group in the second modifier has the same meaning as the first functional group in the first modifier, and also has the same examples. The number of first functional groups in the second modifier is smaller than the number of first functional groups contained in one molecule of the first modifier. That is, when the number of first functional groups contained in one molecule of the first modifier is 2, the number of first functional groups in the second modifier is 1. When the number of first functional groups contained in one molecule of the first modifier is 3, the number of first functional groups in the second modifier is 1 or 2. From the viewpoint of availability of the second modifier, the number of first functional groups in the second modifier may be 1. When the second modifier contains a plurality of first functional groups, the plurality of first functional groups may be the same or different.

The second functional group in the second modifier has the same meaning as the second functional group in the first modifier, and also has the same examples. The number of second functional groups in the second modifier is an integer of 1 or more, and may be an integer equal to or less than (valence of an atom to which the first functional group and the second functional group are directly bonded)-(the number of first functional groups in the second modifier). When the number of first functional groups in the first modifier is 1, the number of second functional groups in the second modifier may be 3. When the second modifier contains a plurality of second functional groups, the plurality of second functional groups may be the same or different.

The atom to which the first functional group and the second functional group in the second modifier are directly bonded has the same meaning as the atom to which the first functional group and the second functional group in the first modifier are directly bonded, and also has the same examples. Also in the second modifier, in addition to the first functional group and the second functional group, a H atom or a third functional group may be bonded to the atom to which the first functional group and the second functional group are directly bonded. The third functional group has the same meaning as the third functional group in the first modifier, and also has the same examples.

The second modifier may have structures containing a tetravalent atom to which the first functional group and the second functional group are directly bonded. Among the structures, the second modifier may have a structure containing a tetravalent atom to which the first functional group and the second functional group are directly bonded. Among the structures, the second modifier may have a structure containing one Si to which the first functional group and the second functional group are directly bonded. That is, more specifically, the second modifier may have a structure containing Si as the center atom to which the first functional group and the second functional group are directly bonded.

The second modifier may have structures containing one amino group in one molecule. Among the structures, the second modifier may have structures containing one amino group and at least one alkyl group in one molecule. Among the structures, the second modifier may have a structure containing one amino group and three alkyl groups in one molecule.

Further, the second modifier may have structures containing Si, which is the center atom, to which one amino group is bonded. Among the structures, the second modifier may have structures containing Si, which is the center atom, to which one amino group and at least one alkyl group are bonded. Among the structure, the second modifier may have a structure containing Si, which is the center atom, to which one amino group and three alkyl groups are bonded.

As described above, the amino group may be the substituted amino group. The substituent of the substituted amino group is as described above.

As the second modifier, for example, a compound represented by the following formula 2 may be used.

$$[R^1]n^2\text{-}(X)\text{—}[R^2]m^2 \quad \text{Formula (2)}$$

In Formula (2), $R^1$ represents the first functional group that directly bonds to X, $R^2$ represents the second functional group or H atom that directly bond to X, X represents a tetravalent atom selected from the group of a C atom, a Si atom, a Ge atom, and tetravalent metal atoms, $n^2$ represents 1 or 2, and $m^2$ represents 2 or 3.

The first functional group represented by $R^1$ has the same meaning as the above-mentioned first functional group, and also has the same examples. When $n^2$ is 2, two $R^1$'s may be the same or different. The second functional group represented by $R^2$ has the same meaning as the above-mentioned second functional group, and also has the same examples. When $m^2$ is 2 or 3, two or three $R^2$'s may be one or two H atoms and the remaining second functional group(s), or may be all the second functional groups. When the two or three $R^2$'s are all the second functional groups, all the second functional groups may be the same or different.

A Si atom may be the tetravalent atom represented by X. $n^2$ may be 1.

$m^2$ may be 3.

As the second modifier, it may be possible to use, for example, dimethylaminotrimethylsilane (($CH_3$)$_2$NSi($CH_3$)$_3$, abbreviation: DMATMS), diethylaminotriethylsilane (($C_2H_5$)$_2$NSi ($C_2H_5$)$_3$, abbreviation: DEATES), dimethylaminotriethylsilane (($CH_3$)$_2$NSi($C_2H_5$)$_3$, abbreviation: DMATES), diethylaminotrimethylsilane (($C_2H_5$)$_2$NSi($CH_3$)$_3$, abbreviation: DEATMS), (trimethylsilyl)amine (($CH_3$)$_3$SiNH$_2$, abbreviation: TMSA), (triethylsilyl)amine (($C_2H_5$)$_3$SiNH$_2$, abbreviation: TESA), (dimethylamino)silane (($CH_3$)$_2$NSiH$_3$, abbreviation: DMAS), (diethylamino)silane (($C_2H_5$)$_2$ NSiH$_3$, abbreviation: DEAS), or the like. As the second modifier, one or more selected from the group of above-described substances may be used.

The first modifier and the second modifier are supplied, as gases, to the wafer 200 via the above-mentioned first modifier supply system and second modifier supply system, respectively, and at least a portion of the first modifier and the second modifier may not have to be gaseous. That is, at least a portion of the first modifier and the second modifier may not have to be gaseous as long as the first modified layer and the third modified layer may be formed in Step A1 and in Step A2 respectively and may be supplied to the wafer 200 via the above-mentioned first modifier supply system and second modifier supply system.

—Inert Gas—

The inert gas used in Steps A1 to A3, in addition to the nitrogen (N$_2$) gas, it may be possible to use, for example, a rare gas such as an argon (Ar) gas, a helium (He) gas, a neon (Ne) gas, a xenon (Xe) gas, or the like. As the inert gas, one or more selected from the group of the above-described gases can be used. This point is the same in each step of using the inert gas to be described below.

—O- and H-Containing Substance—

As the O- and H-containing substance used in Step A3, it may be possible to use an O-containing gas containing an OH bond, such as water vapor (H$_2$O gas) or a hydrogen peroxide (H$_2$O$_2$) gas. Further, as the O- and H-containing substance, it may also be possible to use an O—H bond-free and O-containing gas such as a hydrogen (H$_2$) gas+oxygen (O$_2$) gas or a H$_2$ gas+ozone (O$_3$) gas. In the present disclosure, the description of two gases such as the "H$_2$ gas+O$_2$ gas" together means a mixture of H$_2$ gas and O$_2$ gas. When the mixture is supplied, the two gases may be mixed (pre-mixed) in a supply pipe and then supplied into the process chamber 201, or the two gases may be supplied separately into the process chamber 201 from different supply pipes and mixed (post-mixed) in the process chamber 201.

The O- and H-containing substance is supplied, usually as a gas, to the wafer 200 via the above-mentioned O- and H-containing substance supply system, and at least a portion of the O- and H-containing substance may not have to be gaseous. That is, at least a portion of the O- and H-containing substance may not have to be gaseous as long as the second modified layer may be formed in Step A3 and the O- and H-containing substance may be supplied to the wafer 200 via the above-mentioned O- and H-containing substance supply system. For example, a portion of the O- and H-containing substance may be in the form of a liquid, for example, a mist. This point is the same in Step B2 to be described below in which the O- and H-containing substance is used.

—Catalyst Gas—

As the catalyst gas used in Step A3, it may be possible to use, for example, an amine-based gas containing C, N, and H. As the amine-based gas, it may be possible to use, for example, a cyclic amine-based gas such as a pyridine gas (C$_5$H$_5$N, abbreviation: py) gas, an aminopyridine (C$_5$H$_6$N$_2$) gas, a picoline (C$_6$H$_7$N) gas, a rutidine (C$_7$H$_9$N) gas, a piperazine (C$_4$H$_{10}$N$_2$) gas, or a piperidine (C$_5$H$_{11}$N) gas, a chain amine-based gas such as a triethylamine (($C_2H_5$)$_3$N, abbreviation: TEA) gas or a diethylamine (($C_2H_5$)$_2$NH, abbreviation: DEA) gas, or the like. As the catalyst gas, one or more selected from the group of the above-described gases may be used. This point is the same in Steps B1 and B2 to be described below in which the catalyst gas is used.

<More Specific Embodiments of Step A>

Here, more specific embodiments of the modification in Step A will be described with reference to FIGS. 7A to 7D. FIGS. 7A to 7D are views focusing on a reaction occurring on a surface of a first base on a surface of a wafer 200, in which a portion of the first base of the surface of the wafer 200 is sampled and shown.

Here, an example in which for the wafer 200 having a surface on which a SiO film is exposed as the first base, bis(dialkylamino)dialkylsilane (abbreviation: BDAADAS) is used as a first modifier and (dialkylamino)trialkylsilane (abbreviation: DAATAS) is used as a second modifier will be described. Here, in FIGS. 7A to 7D, both R and R' indicate alkyl groups.

Figure 7A:
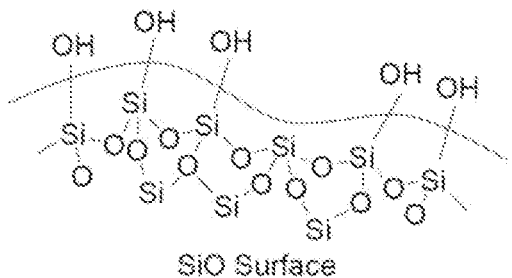
FIG. 7A is a schematic view showing a chemical structure of a surface of a SiO film of a wafer 200.

As shown in FIG. 7A, the surface of the SiO film exposed on the surface of the wafer 200 has a chemical structure containing many OH terminations. In Step A1, when BDAADAS as the first modifier is supplied to the wafer 200, BDAADAS is chemically adsorbed on the surface of the SiO film.

Figure 7B:
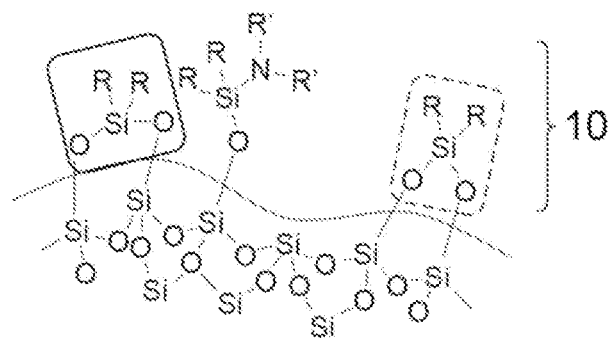
FIG. 7B is a schematic view showing a chemical structure formed by supplying bis(dialkylamino)dialkylsilane to the surface of the SiO film shown in FIG. 7A.

More specifically, as shown in FIG. 7B, in a portion of the surface of the SiO film where two OH terminations are close to each other (for example, a portion having a "Vicinal" or "Germinal" structure in Table 1), the two OH groups react with two dialkylamino groups contained in one BDAADAS molecule such that one Si atom contained in one BDAADAS molecule is bonded to two O atoms of the two OH groups and is chemically adsorbed to form a bridged structure (crosslinked structure). By this chemical adsorption, the two dialkylamino groups (corresponding to the first functional group) are desorbed from the BDAADAS molecule, and a residue (">$SiR_2$ group" in FIG. 7B) containing two alkyl groups is left on the surface of the SiO film. This is an embodiment in which BDAADAS is chemically adsorbed on the surface of the SiO film.

Further, as shown in FIG. 7B, in a portion of the surface of the SiO film where two OH terminations are isolated from each other (for example, a portion having an "Isolated" structure in Table 1), one of the two OH groups react with one dialkylamino group contained in one BDAADAS molecule such that one Si atom contained in one BDAADAS molecule is bonded to an O atom of the one OH group and is chemically adsorbed. By this chemical adsorption, one dialkylamino group (corresponding to the first functional group) is desorbed from the BDAADAS molecule, and a residue ("—$SiR_2(NR'_2)$ group" in FIG. 7B) containing two alkyl groups and one dialkylamino group is left on the surface of the SiO film. This is another embodiment in which BDAADAS is chemically adsorbed on the surface of the SiO film.

In this way, BDAADAS may be chemically adsorbed regardless of the structure of OH termination on the surface of the SiO film. As a result, a first modified layer 10 containing the ">$SiR_2$ group" and the "—$SiR_2(NR'_2)$ group," which are residues derived from BDAADAS, is formed on the surface of the SiO film.

Next, in Step A3, when an O- and H-containing gas as the O- and H-containing substance is supplied to the wafer 200, an OH termination is formed on the first modified layer 10 formed on the surface of the SiO film in Step A1.

Figure 7C:
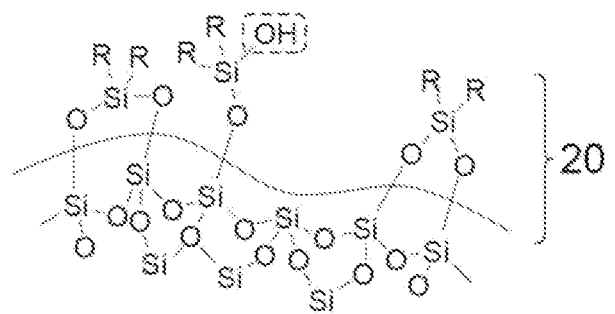
FIG. 7C is a schematic view showing a chemical structure formed by supplying an O- and H-containing substance to the surface of the SiO film shown in FIG. 7B.

More specifically, in Step A3, the dialkylamino group contained in the first modified layer formed in Step A1 reacts with the O- and H-containing gas (specifically, a hydrolysis reaction), the dialkylamino group contained in the first modified layer 10 is substituted with an OH group, as shown in FIG. 7C. As a result, the first modified layer 10 formed on the surface of the SiO film changes to a second modified layer 20 containing an OH termination. According to Step A3, the dialkylamino group is desorbed from the first modified layer 10 by the above-described reaction, such that the dialkylamino group is almost absent in the obtained second modified layer 20.

Subsequently, in Step A2, when DAATAS as the second modifier is supplied to the wafer 200, DAATAS is chemically adsorbed on the OH termination of the second modified layer 20 formed in Step A3.

More specifically, the OH group of the OH termination contained in the second modified layer 20 formed in Step A3 reacts with the dialkylamino group contained in the DAATAS molecule, such that a Si atom contained in the DAATAS molecule is bonded to an O atom of the OH group and is chemically adsorbed. By this chemical adsorption, one dialkylamino group (corresponding to the first functional group) is desorbed from DAATAS, and a residue containing three alkyl groups ("—$SiR_3$ group (trialkylsilyl group)" in FIG. 7D) is left. This is an embodiment in which DAATAS is chemically adsorbed on the second modified layer 20.

In this way, the third modified layer 30 containing the residue derived from BDAADAS and the residue derived from DAATAS is formed on the surface of the SiO film. As described above, since DAATAS as the second modifier is a compound containing one dialkylamino group corresponding to the first functional group, the dialkylamino group is desorbed by the above-described reaction. Therefore, the dialkylamino group is difficult to be introduced into the obtained third modified layer 30 and thus is almost absent in the third modified layer 30.

The outermost surface of the third modified layer 30, that is, the outermost surface of the SiO film, is covered with the residue derived from BDAADAS and the residue derived from DAATAS. That is, the outermost surface of the SiO film is covered with an alkyl group (corresponding to the second functional group) contained in the residue derived from BDAADAS and an alkyl group (corresponding to the second functional group) contained in the residue derived from DAATAS. As a result, the outermost surface of the SiO film is terminated with the alkyl group (corresponding to the second functional group) contained in the residue derived from BDAADAS and the alkyl group (corresponding to the second functional group) contained in the residue derived from DAATAS.

The third modified layer 30 containing the residue derived from BDAADAS and the residue derived from DAATAS is formed on the surface of the SiO film after Step A1, Step A3, and Step A2 are performed in this order. As shown in FIG. 7D, the formed third modified layer 30 contains many chemically highly stable alkyl groups, and also contains a trialkylsilyl group with large steric hindrance, which is high in abundance density of chemically highly stable alkyl groups, as a residue derived from DAATAS. Therefore, at the time of forming a film on the wafer 200 including the SiO film having the surface on which the third modified layer 30 is formed, it is possible to effectively suppress physical adsorption and chemical adsorption of a film-forming precursor on the surface of the SiO film. That is, by using the wafer 200 subjected to the modification by performing Step A1, Step A3, and Step A2 in this order, it is possible to suppress selection rupture and thus enhance selectivity in selective growth at the time of the subsequent film formation.

(Performing One or More Times)

In Step A, Step A1 and Step A3 may be performed one or more times. By performing these steps one or more times, it is possible to more sufficiently chemically adsorb the first modifier on more OH terminations on the surface of the first base and more sufficiently substitute the first functional group contained in the first modified layer with an OH group. Therefore, by performing these steps one or more times and then performing Step A2, it is possible to increase a modification density of the surface of the first base, that is, a termination rate of the surface of the first base by the second functional group.

Further, in Step A, Step A1, Step A3, and Step A2 may be performed one or more times. By performing these steps one or more times, it is possible to increase the modification density of the surface of the first base, that is, the termination rate of the surface of the first base by the second functional group. The above-described steps may be performed one or more times until the modification density of the surface of the first base reaches a desired level.

(Step B)

In Step B, a film is selectively formed on the surface of the second base by supplying film-forming gases (a precursor gas, a reaction gas, and a catalyst gas) to the wafer 200 after the surface of the first base is modified in Step A, that is, the wafer 200 after the third modified layer is formed on the surface of the first base. In Step B, an output of the heater 207 may be regulated to maintain a temperature of the wafer 200 at a temperature equal to or lower than a temperature of the wafer 200 at Step A, specifically a temperature lower than the temperature of the wafer 200 at Step A.

In Step B, the precursor gas and the reaction gas as the film-forming gases may be alternately supplied to the wafer 200, or the precursor gas and the reaction gas as the film-forming gases may be alternately supplied to the wafer 200 and the catalyst gas may be supplied together with at least one selected from the group of the precursor gas and the reaction gas. However, depending on process conditions, the catalyst gas may not have to be supplied and may be omitted. For example, in Step B, any of the following processing sequences may be performed. In the following processing sequences, Step B is sampled and shown.

(Precursor gas→Reaction gas)×n
(Precursor gas→Reaction gas+Catalyst gas)×n
(Precursor gas+Catalyst gas→Reaction gas)×n
(Precursor gas+Catalyst gas→Reaction gas+Catalyst gas)×n In the following, an example in which the catalyst gas is used in combination to the precursor gas and the reaction gas, specifically, in Step B, the precursor gas and the reaction gas are alternately supplied as the film-forming gases, and the catalyst gas is supplied together with each of the precursor gas and the reaction gas, will be described. Specifically, in Step B, the next Steps B1 and B2 are sequentially executed. As described above, FIG. 6 shows an example in which, for example, the O- and H-containing substance is used as the reaction gas.

(Step B1)

In Step B1, the precursor gas and the catalyst gas are supplied to the wafer 200 in the process chamber 201, that is, the wafer 200 after the third modified layer is formed on the surface of the first base.

Specifically, the valves 243b and 243d are opened to allow the precursor gas to flow through the gas supply pipe 232b and the catalyst gas to flow through the gas supply pipe 232d, respectively. The flow rates of the precursor gas and the catalyst gas are regulated by the MFCs 241b and 241d, respectively, and the precursor gas and the catalyst gas are supplied into the process chamber 201 via the nozzles 249b and 249a, mixed after being supplied into the process chamber 201, and are exhausted via the exhaust port 231a. In this operation, the precursor gas and the catalyst gas are supplied to the wafer 200. At this time, the valves 243e to 243g may be opened to allow an inert gas to be supplied into the process chamber 201 via the nozzles 249a to 249c, respectively.

By supplying the precursor gas and the catalyst gas to the wafer 200 under process conditions to be described below, it is possible to selectively (preferentially) adsorb the precursor gas on the surface of the second base while suppressing adsorption of the precursor gas on the third modified layer, that is, the surface of the first base. Thus, the precursor gas is adsorbed on the surface of the second base, and for example, a first layer having a thickness of less than one atomic layer (one molecular layer) to several atomic layers (several molecular layers) is formed.

In Step B1, by supplying the catalyst gas together with the precursor gas, it is possible to progress the above-described reaction under a non-plasma atmosphere and under a low-temperature condition as described below. In this way, by forming the first layer under the non-plasma atmosphere and under the low temperature condition as described below, it is possible to prevent the third modified layer formed on the surface of the first base from being removed (desorbed) from the surface of the first base.

Further, in Step B1, when the first layer is formed, the precursor gas may be adsorbed on a portion of the surface of the first base, but an amount of the adsorption is very small and is much smaller than the amount of adsorption of the precursor gas on the surface of the second base. Such selective (preferential) adsorption is possible because the third modified layer acting as a film formation inhibition layer is formed over the entire surface of the first base, whereas the third modified layer acting as the film formation inhibition layer is not formed in many regions of the surface of the second base or the entire surface of the second base. This is also because the process condition in Step B1 is the condition in which the precursor gas does not undergo gas phase decomposition (autolysis) in the process chamber 201. By setting the condition that the precursor gas does not undergo gas phase decomposition, it is possible to selectively adsorb the precursor gas on the surface of the second base without depositing decomposition products such as intermediates generated by the gas phase decomposition of the precursor gas on the surface of the first base and the surface of the second base.

After the first layer is selectively formed on the surface of the second base, the valves 243b and 243d are closed to stop the supply of the precursor gas and the catalyst gas into the process chamber 201, respectively. Then, a gas and the like remaining in the process chamber 201 are removed from the process chamber 201 (purging) according to the same processing procedure and process conditions as those in the above-described Step A1.

A process condition in this step is exemplified as follows.
Processing temperature: room temperature (25 degrees C.) to 200 degrees C., specifically room temperature to 120 degrees C.
Processing pressure: 133 to 1,333 Pa
Precursor gas supply flow rate: 1 to 2,000 sccm
Precursor gas supply time: 1 to 60 seconds
Catalyst gas supply flow rate: 1 to 2,000 sccm
Inert gas supply flow rate (for each gas supply pipe): 0 to 20,000 sccm —Precursor Gas—

As the precursor gas, it may be possible to use, for example, a Si- and halogen-containing gas. Halogen includes chlorine (Cl), fluorine (F), bromine (Br), iodine (I), and the like. The Si- and halogen-containing gas may contain halogen in the form of a chemical bond between Si and halogen. The Si- and halogen-containing gas may further contain C, and in that case C may be contained in the form of a Si—C bond. As the Si- and halogen-containing gas, it may be possible to use, for example, a silane-based gas containing Si, Cl, and an alkylene group and containing a Si—C bond, that is, an alkylenechlorosilane-based gas. Here, the alkylene group includes a methylene group, an ethylene group, a propylene group, a butylene group, and the like. The alkylenechlorosilane-based gas may contain Cl in the form of a Si—Cl bond and C in the form of a Si—C bond. In this way, as the precursor gas, it may be possible to use, for example, a Si- and halogen-containing gas, a Si-, C-, and halogen-containing gas, or the like.

As the precursor gas, it may be possible to use, for example, an alkylenechlorosilane-based gas such as a bis(trichlorosilyl)methane (($SiCl_3)_2CH_2$, abbreviation: BTCSM) gas or a 1,2-bis(trichlorosilyl)ethane (($SiCl_3)_2C_2H_4$, abbreviation: BTCSE) gas, an alkylchlorosilane-based gas such as a 1,1,2,2-tetrachloro-1,2-dimethyldisilane (($CH_3)_2Si_2Cl_4$, abbreviation: TCDMDS) gas or a 1,2-dichloro-1,1,2,2-tetramethyldisilane (($CH_3)_4Si_2Cl_2$, abbreviation: DCTMDS) gas, a gas containing a cyclic structure formed of Si and C and containing halogen, such as a 1,1,3,3-tetrachloro-1,3-disilacyclobutane ($C_2H_4Cl_4Si_2$, abbreviation: TCDSCB) gas, or the like. Further, as the precursor gas, it may be possible to use, for example, an inorganic chlorosilane-based gas such as a tetrachlorosilane ($SiCl_4$, abbreviation: STC) gas, a hexachlorodisilane ($Si_2Cl_6$, abbreviation: HCDS) gas, or an octachlorotrisilane ($Si_3Cl_8$, abbreviation: OCTS) gas. As the precursor gas, one or more selected from the group of these gases may be used.

—Catalyst Gas—

As the catalyst gas, it may be possible to use, for example, the same catalyst gas as the various catalyst gases exemplified in the above-described Step A3.

(Step B2)

In Step B2, after the first layer is formed in Step B1, a reaction gas and a catalyst gas are applied to the wafer 200 in the process chamber 201, that is, the first layer selectively formed on the surface of the second base. Hereinafter, an example in which, for example, an O- and H-containing substance is used as the reaction gas will be described.

Specifically, the valves 243c and 243d are opened to allow the O- and H-containing substance as the reaction gas to flow through the gas supply pipe 232c and allow the catalyst gas to flow through the gas supply pipe 232d, respectively. The flow rates of the O- and H-containing substance and the catalyst gas are regulated by the MFCs 241c and 241d, respectively, and the O- and H-containing substance and the catalyst gas are supplied into the process chamber 201 via the nozzles 249c and 249a, mixed after being supplied into the process chamber 210, and exhausted via the exhaust port 231a. In this operation, the O- and H-containing substance and the catalyst gas are supplied to the wafer 200. At this time, the valves 243e to 243g may be opened to allow an inert gas to be supplied into the process chamber 201 via the nozzles 249a to 249c, respectively.

By supplying the O- and H-containing substance and the catalyst gas to the wafer 200 under process conditions to be described below, it is possible to oxidize at least a portion of the first layer formed on the surface of the second base in Step B1. Thus, a second layer formed by oxidizing the first layer is formed on the surface of the second base. When the second layer is formed, impurities such as Cl contained in the first layer may form gaseous substances containing impurities such as Cl in the process of oxidation reaction by the O- and H-containing substance of the first layer, and may be removed from the first layer and discharged from the interior of the process chamber 201. Thus, the second layer becomes a layer containing fewer impurities such as Cl than the first layer.

In Step B2, by supplying the catalyst gas together with the O- and H-containing substance, it is possible to progress the above-described reaction under a non-plasma atmosphere and under a low temperature condition as described below. In this way, by forming the second layer under the non-plasma atmosphere and under the low temperature condition as described below, it is possible to prevent the third modified layer formed on the surface of the first base from being removed (desorbed) from the surface of the first base.

After the first layer formed on the surface of the second base is oxidized to be changed to the second layer, the valves 243c and 243d are closed to stop the supply of the O- and H-containing substance and the catalyst gas as the reaction gases into the process chamber 201, respectively. Then, a gas and the like remaining in the process chamber 201 are removed from the process chamber 201 (purging) according to the same processing procedure and process condition as those in the purging of the above-described Step A1.

A process condition in this step is exemplified as follows.
Processing temperature: room temperature (25 degrees C.) to 200 degrees C., specifically room temperature to 120 degrees C.
Processing pressure: 133 to 1,333 Pa
Reaction gas supply flow rate: 1 to 2,000 sccm
Reaction gas supply time: 1 to 60 seconds
Catalyst gas supply flow rate: 1 to 2,000 sccm
Inert gas supply flow rate (for each gas supply pipe): 0 to 20,000 sccm —Reaction Gas—

As the reaction gas, an O- and H-containing substance may be used when forming an oxide film-based film. As the O- and H-containing substance, it may be possible to use, for example, the same O- and H-containing substance as the various O- and H-containing substances exemplified in the above-described Step A3. In addition to this, as the reaction gas, it may be possible to use, for example, an oxygen (O)-containing gas such as an oxygen ($O_2$) gas, an ozone ($O_3$) gas, a nitrous oxide ($N_2O$) gas, a nitrogen monoxide (NO) gas, a nitrogen dioxide ($NO_2$) gas, a carbon monoxide (CO) gas, or a carbon dioxide ($CO_2$) gas. Since most of O- and H-containing substances are also O-containing gases, the O- and H-containing substance may be referred to as an O-containing gas for the sake of convenience. As the reaction gas, one or more selected from the group of these gases may be used.

Further, as the reaction gas, a nitriding agent (nitriding gas) may be used when forming a nitride film-based film. As the nitriding agent, it may be possible to use a N- and H-containing gas. As the N- and H-containing gas, it may be possible to use, for example, a hydrogen nitride-based gas containing a N—H bond, such as an ammonia ($NH_3$) gas, a hydrazine ($N_2H_4$) gas, a diazene ($N_2H_2$) gas, or a $N_3H_8$ gas. When forming the nitride film-based film, the above-mentioned O- and H-containing substance, oxidation, and oxidation reaction may be substituted with a nitriding agent, nitriding, and nitriding reaction, respectively. As the reaction gas, one or more selected from the group of these gases may be used.

—Catalyst Gas—

As the catalyst gas, it may be possible to use, for example, the same catalyst gas as the various catalyst gases exemplified in the above-described Step A3.

(Performing Predetermined Number of Times)

Figure 8C:
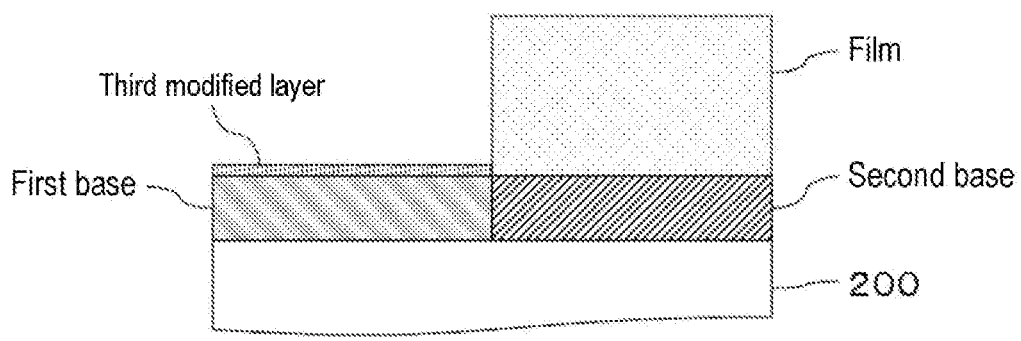

By performing a cycle a predetermined number of times (n times, where n is an integer of 1 or more), the cycle including non-simultaneously, that is, without synchronization, performing the above-described steps B1 and B2, it is possible to selectively form a film having a desired film thickness on the surface of the second base of the first base and the second base exposed on the surface of the wafer 200, as shown in FIG. 8C. The above-described cycle may be performed one or more times. That is, by setting the thickness of the second layer formed per cycle to be smaller than a desired film thickness and laminating the second layers, the above-described cycle may be performed one or more times until a film to be selectively grown reaches the desired film thickness.

When performing Step B1 and Step B2, a very slight film may be formed on the surface of the first base. However, even in this case, the film thickness of a film formed on the surface of the first base is much smaller than the film thickness of a film formed on the surface of the second base. In the present disclosure, it is assumed that "high selectivity in selective growth" includes not only a case where no film is formed on the surface of the first base but a film is formed on the surface of the second base but also, as described above, a case where a very thin film is formed on the surface of the first base but a film, which is much thicker than the film formed on the surface of the first base, is formed on the surface of the second base.

In the selective growth in Step B, an obtained film differs depending on the types of precursor gas and reaction gas. For example, in Step B, by using a Si-, C-, and halogen-containing gas as the precursor gas and using an O-containing gas as the reaction gas, a silicon oxycarbide film (SiOC film) may be formed as the film. Further, for example, in Step B, by using a Si-, C-, and halogen-containing gas as the precursor gases and using a N- and H-containing gas as the reaction gas, a silicon carbonitride film (SiCN film) may be formed as the film. Further, for example, in Step B, by using a Si-, C- and halogen-containing gas as the precursor gas and using an O-containing gas and a N- and H-containing gas as the reaction gases, a silicon oxycarbonitride film (SiOCN film) may be formed as the film. Further, for example, in Step B, by using a Si- and halogen-containing gas as the precursor gas and using an O-containing gas as the reaction gas, a silicon oxide film (SiO film) can be formed as the film. Further, for example, in Step B, by using a Si- and halogen-containing gas as the precursor gas and using a N- and H-containing gas as the reaction gas, a silicon nitride film (SiN film) may be formed as the film. In this way, in Step B, various films such as a silicon-based oxide film and a silicon-based nitride film may be formed. As described above, depending on the process conditions, the catalyst gas may not have to be used, and when the catalyst gas is not used, the processing temperature in Step B may be set to a predetermined temperature within the range of, for example, 200 to 500 degrees C.

Further, in the selective growth in Step B, by using a gas containing a metal element such as Al, Ti, Hf, Zr, Ta, Mo, or W as the precursor gas and using an O-containing gas or a N- and H-containing gas as the reaction gas, for example, a metal-based oxide film such as an aluminum oxide film (AlO film), a titanium oxide film (TiO film), a hafnium oxide film (HfO film), a zirconium oxide film (ZrO film), a tantalum oxide film (TaO film), a molybdenum oxide film (MoO film), or a tungsten oxide film (WO film), a metal-based nitride film such as an aluminum nitride film (AlN film), a titanium nitride film (TiN film), a hafnium nitride film (HfN film), a zirconium nitride film (ZrN film), a tantalum nitride film (TaN film), a molybdenum nitride film (MoN film), or a tungsten nitride film (WN film), or the like may be formed as the film. As described above, depending on the process conditions, the catalyst gas may not have to be used, and when the catalyst gas is not used, the processing temperature in Step B may be set to a predetermined temperature within the range of, for example, 200 to 500 degrees C.

(Step C)

In Step C, by performing Step A and Step B, an annealing process is performed on the wafer 200 after the selective growth is completed.

Specifically, after the selective growth is completed, the output of the heater 207 is regulated such that an internal temperature of the process chamber 201, that is, the temperature of the wafer 200 after the film is selectively formed on the surface of the second base, is set to a temperature equal to or higher than the temperature of the wafer 200 in the selective growth, specifically higher than the temperature of the wafer 200 in the selective growth, and then the selective-grown wafer 200 is heated to perform the annealing process on the wafer 200.

This makes it possible to invalidate the function of the third modified layer on the surface of the first base as an inhibitor. Specifically, by annealing the selective-grown wafer 200, it is possible to desorb and remove the second functional group contained in the third modified layer from the surface of the first base or invalidate the function as an inhibitor in the second functional group. The invalidation of the function as an inhibitor in the second functional group means that the molecular structure of the second functional group, the arrangement structure of atoms, and the like are changed to make it possible to adsorb film-forming gases (the precursor gas, the reaction gas, etc.) on the surface of the first base and make a reaction between the surface of the first base and the film-forming gases (the precursor gas, the reaction gas, etc.).

Figure 8D:
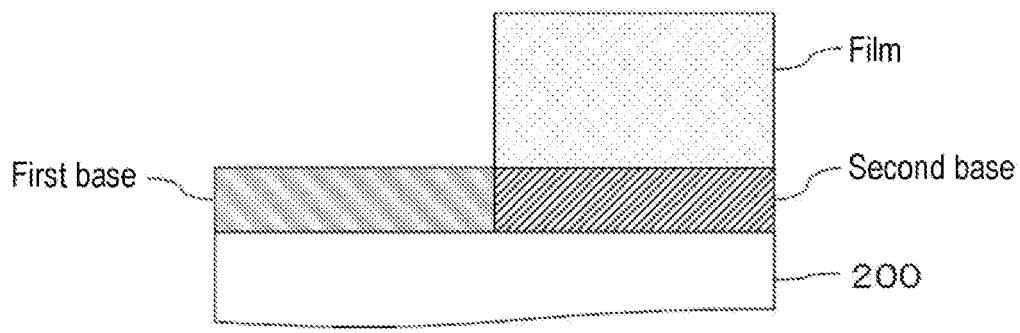

In Step C, by invalidating the function of the third modified layer as the inhibitor to reset the film formation inhibition state on the surface of the first base, it is possible to progress a film-forming process on the surface of the first base in the subsequent steps. Further, by annealing the selective-grown wafer 200, when the second functional group contained in the third modified layer is desorbed and removed from the surface of the first base, the third modified layer itself may be desorbed and removed. FIG. 8D shows a state in which the third modified layer itself is removed from the surface of the first base exposed on the surface of the wafer 200.

Step C may be performed in a state where a gas (assist gas) that promotes the removal (desorption) of the second functional group (for example, a alkyl group such as a methyl group) contained in the third modified layer, such as a N-containing gas such as a $N_2$ gas, a H-containing gas such as a $H_2$ gas, or an O-containing gas such as an $O_2$ gas, is supplied into the process chamber 201, or may be performed in a state where the supply of the assist gas into the process chamber 201 is stopped. In addition to this, the above-described reaction gas may also be used as the assist gas.

A process condition in Step C is exemplified as follows.
Processing temperature: 200 to 1,000 degrees C., specifically 400 to 700 degrees C.
Processing pressure: 1 to 120,000 Pa
Assist gas supply flow rate: 0 to 50,000 sccm
Assist gas supply time: 1 to 18,000 seconds (After-Purge and Returning to Atmospheric Pressure)

After the selective growth of the film on the surface of the second base is completed and the reset of the film formation inhibition state on the surface of the first base is completed, an inert gas as a purge gas is supplied from each of the nozzles 249a to 249c into the process chamber 201 and is exhaust via the exhaust port 231a. Thus, the interior of the process chamber 201 is purged to remove a gas, reaction by-products, and the like remaining in the process chamber 201 from the process chamber 201 (after-purge). Then, the internal atmosphere of the process chamber 201 is substituted with the inert gas (inert gas substitution) and the internal pressure of the process chamber 201 is returned to the atmospheric pressure (returning to atmospheric pressure).

(Boat Unloading and Wafer Discharging)

Thereafter, the seal cap 219 is lowered by the boat elevator 115 to open the lower end of the manifold 209. Then, the processed wafers 200 supported by the boat 217 are unloaded from the lower end of the manifold 209 to the outside of the reaction tube 203 (boat unloading). After the boat unloading, the shutter 219s is moved and the lower end opening of the manifold 209 is sealed by the shutter 219s via the O-ring 220c (shutter closing). The processed wafers 200 are unloaded from the reaction tube 203 and are discharged from the boat 217 (wafer discharging).

(3) Effects of the Embodiments

According to the embodiments of the present disclosure, one or more effects set forth below may be achieved.

In Step A, by using the first modifier and the second modifier, it is possible to improve the selectivity in the selective growth.

That is, the first modifier contains one or more atoms to which the first functional group and the second functional group are directly bonded such that the number of first functional groups in one molecule of the first modifier that are capable of chemically adsorbing the first modifier at the adsorption site (for example, the OH termination) on the surface of the first base is larger (for example, by two or more) than the number of first functional groups contained in one molecule of the second modifier. When the first modifier has such a structure, it is possible to more effectively chemically adsorb the first modifier on the surface (the adsorption site of the surface) of the first base regardless of structures of the adsorption sites (for example, three structures of Vicinal, Germinal, and Isolated at the OH termination) on the surface of the first base. That is, the first modifier may be chemically adsorbed on the adsorption sites existing on the entire surface of the first base. Further, the second functional group having high chemical stability is present on the surface of the first base after the first modifier is chemically adsorbed.

Further, the second modifier contains an atom to which the first functional group and the second functional group are directly bonded, and the number of first functional groups contained in one molecule of the second modifier is smaller than the number of first functional groups contained in one molecule of the first modifier. When the second modifier has such a structure and the first modifier has the above-mentioned structure, the second modifier may be chemically adsorbed on the first modifier. On the surface of the first base after the second modifier is chemically adsorbed on the first modifier, a large amount of second functional groups having high chemical stability are present at a high abundance density. In this state, the surface of the first base is terminated with the second functional group contained in the residue derived from the first modifier and the second functional group contained in the residue derived from the second modifier.

For example, when the first modifier and the second modifier are supplied in this order, after the first modifier is chemically adsorbed on the surface of the first base, not only the highly chemically stable second functional group but also a portion of first functional groups remain on the surface of the first base. By converting the first functional groups remaining on the surface of the first base into an adsorption site such as an OH group, the second modifier may be chemically adsorbed on this OH group by a chemical reaction between the OH group and the first functional group of the second modifier. Since the second modifier contains more second functional groups with high chemical stability than the first modifier in its molecule, the surface of the first base after the second modifier is chemically adsorbed contains more second functional groups with high chemical stability than before the second modifier is chemically adsorbed, and contains the second functional group that is high in the abundance density of the second functional group with high chemical stability and forms larger steric hindrance. That is, on the surface of the first base after the modification is performed with the first modifier and the second modifier, there are many second functional groups with high chemical stability, and moreover, there is extremely large steric hindrance formed by the second functional group present at high density and having high chemical stability. That is, in this state, the surface of the first base is terminated at high density with the second functional group with high chemical stability contained in the residue derived from the first modifier and the second functional group with high chemical stability contained in the residue derived from the second modifier. This makes it possible to more effectively inhibit the adsorption of the precursor gas on the surface of the first base at the time of film formation. As a result, it is possible to suppress the selection rupture and thus improve the selectivity in selective growth.

In Step A, by non-simultaneously performing Step A1 and Step A2, particularly performing Step A1 and Step A2 in this order, it is possible to appropriately generate the above-mentioned chemical reaction stepwise (in multiple steps). As a result, on the surface of the first base, there are many second functional groups with high chemical stability, and moreover, there is extremely large steric hindrance formed by the second functional group present at high density and having high chemical stability. This makes it possible to more effectively inhibit the adsorption of the precursor gas on the surface of the first base at the time of film formation, and as a result, it is possible to suppress the selection rupture and thus further improve the selectivity in selective growth.

In Step A, by performing Step A1, Step A3, and Step A2 in this order, it is possible to more appropriately generate the above-mentioned chemical reaction stepwise (in multiple steps). As a result, on the surface of the first base, there are many second functional groups with high chemical stability, and moreover, there is extremely large steric hindrance formed by the second functional group present at high density and having high chemical stability. This makes it possible to more effectively inhibit the adsorption of the precursor gas on the surface of the first base at the time of film formation, and as a result, it is possible to suppress the selection rupture and thus further improve the selectivity in selective growth.

In this case, in Step A1, by adsorbing a portion of the first modifier on the surface of the first base in a state where the portion of the first modifier contains at least one first functional group, it is possible to more appropriately generate the above-mentioned chemical reaction.

Further, in this case, in Step A1, by adsorbing the first modifier on the surface of the first base in a state where the first modifier contains the second functional group, and in Step A2, by adsorbing the second modifier on an OH group (that is, an adsorption site) in a state where the second modifier contains the second functional group, it is possible to more appropriately generate the above-mentioned chemical reaction.

Further, in this case, in Step A1, a portion of the first modifier may be adsorbed on the surface of the first base by using a reaction between two OH groups (that is, adsorption sites) present on the surface of the first base and adjacent to each other and the first modifier of one molecule. That is, it is possible to cause the two OH groups present on the surface of the first base and adjacent to each other to react with two or more first functional groups of the first modifier of one molecule. Thus, it is possible to inhibit the adsorption of the two OH groups with the first modifier of one molecule and thus generate more appropriately and efficiently the above-mentioned chemical reaction.

In Step A, by performing Step A1 and Step A3 one or more times, and by performing Step A1, Step A3, and Step A2 one or more times, it is possible to increase the modification density of the surface of the first base. In other words, by performing such a process one or more times, the third modified layer may be more sufficiently formed over the entire surface of the first base. By more sufficiently forming the third modified layer over the entire surface of the first base, it is possible to more effectively suppress the selection rupture and thus further enhance the selectivity in selective growth.

In Step A3, by supplying the O- and H-containing gas as the O- and H-containing substance to the wafer 200, it is possible to more efficiently convert the first functional group present on the surface of the first base to the OH group, which makes it possible to more appropriately generate the above-mentioned chemical reaction.

By using the first modifier containing two first functional groups contained in one molecule and the second modifier containing one first functional group contained in one molecule, it is possible to more appropriately generate the above-mentioned chemical reaction. Further, by using the first modifier having two first functional groups contained in one molecule and two second functional groups contained in one molecule and the second modifier one first functional group contained in one molecule and three second functional groups contained in one molecule, it is possible to more and more appropriately generate the above-mentioned chemical reaction.

By using the first modifier having a structure containing a tetravalent atom to which the first functional group and the second functional group are directly bonded, and the second modifier having a structure containing a tetravalent atom to which the first functional group and the second functional group are directly bonded, it is possible to more appropriately generate the above-mentioned chemical reaction.

By using the first modifier and the second modifier in which the first functional group is an amino group, it is possible to more appropriately generate the above-mentioned chemical reaction. By using the first modifier and the second modifier in which the first functional group is a substituted amino group, it is possible to more and more appropriately generate the above-mentioned chemical reaction.

By using the first modifier and the second modifier in which the second functional group is a hydrocarbon group, it is possible to more appropriately generate the above-mentioned chemical reaction. By using the first modifier and the second modifier in which the second functional group is an alkyl group, it is possible to more and more appropriately generate the above-mentioned chemical reaction.

By performing each step on the wafer 200 in which the first base is an oxide film and the second base is a film other than the oxide film, it is possible to more appropriately generate the above-mentioned chemical reaction. By performing each step on the wafer 200 in which the first base is an O-containing film (for example, SiO film) and the second base is an O-free film (for example, SiN film or Si film), it is possible to more and more appropriately generate the above-mentioned chemical reaction.

By performing Step A and Step B under a non-plasma atmosphere, it is possible to properly perform the modification of the surface of the first base and the selective growth on the surface of the second base. Further, by performing Step A and Step B under the non-plasma atmosphere, plasma damage to the wafer 200 may be avoided.

(4) Modifications

The processing sequence in the embodiments of the present disclosure may be changed as shown in the following modifications. These modifications may be used in proper combination. Unless otherwise stated, the processing procedure and process conditions in each step of each modification may be the same as the processing procedure and process condition in each step of the above-described processing sequence.

First Modification

Before performing the modification in Step A, the surface of the wafer 200 may be further exposed to a hydrogen fluoride (HF) aqueous solution in Step A4. By performing a cleaning process (also referred to as DHF cleaning) by using the HF aqueous solution in Step A4, it is possible to remove a natural oxide film formed on at least one selected from the group of the surfaces of the first base and the second base.

In this modification, the same effects as those in the above-described embodiments are obtained. Further, according to this modification, it is possible to more reliably terminate the surface of the first base with an OH group. Therefore, in the subsequent modification in Step A, it is possible to more sufficiently form the third modified layer over the entire surface of the first base. This makes it possible to further enhance the selectivity in selective growth.

Second Modification

Instead of supplying the O- and H-containing substance (for example, an O- and H-containing gas) to the wafer 200 in Step A3, the wafer 200 may be exposed to the atmosphere. That is, by exposing the wafer 200 to the atmosphere, the atmosphere (water ($H_2O$) contained in the atmosphere) as the O- and H-containing substance may be supplied to the wafer 200. In this modification, the same effects as those in the above-described embodiments are obtained. In this case, the water as the O- and H-containing substance may be a gas or a liquid, for example, a mist.

Other Embodiments of the Present Disclosure

The embodiments of the present disclosure have been specifically described above. However, the present disclosure is not limited to the above-described embodiments, but may be changed in various ways without departing from the gist thereof.

For example, after performing the selective growth in Step B, post-treatment (Step C) may not be performed. In this case as well, the same effects as those described above are obtain except for the effect obtained by the post-treatment. Depending on steps performed after the selective growth, it may not have to reset the film formation inhibition state on the surface of the first base, and in that case post-treatment may not have to be performed.

Further, for example, the wafer 200 may include a plurality of types of films as the first base, or may include a plurality of types of films as the second base. The films constituting the first base and the second base may include films containing semiconductor elements, such as a SiOCN film, a SiON film, a SiOC film, a SiC film, a SiCN film, a SiBN film, a SiBCN film, a Ge film, and a SiGe film, films containing metal elements, such as a TiN film and a W film, an amorphous carbon film (a-C film), and the like, in addition to the above-mentioned SiO film and SiN film. Any film having a surface that may be modified by the first modifier and the second modifier (that is, a surface having an adsorption site) may be used as the first base. On the other hand, any film having a surface that is difficult to be modified by the first modifier and the second modifier (that is, a surface having no or few adsorption sites) may be used as the second base. Even in that case, the same effects as those in the above-described embodiments are obtained.

Recipes used in each process may be provided individually according to the processing contents and may be stored in the memory 121c via a telecommunication line or the external memory 123. Moreover, at the beginning of each process, the CPU 121a may properly select an appropriate recipe from the recipes stored in the memory 121c according to the processing contents. Thus, it is possible for a single substrate processing apparatus to form films of various kinds, composition ratios, qualities, and thicknesses with enhanced reproducibility. Further, it is possible to reduce an operator's burden and to quickly start each process while avoiding an operation error.

The recipes mentioned above are not limited to newly-provided ones but may be provided, for example, by modifying existing recipes that are already installed in the substrate processing apparatus. Once the recipes are modified, the modified recipes may be installed in the substrate processing apparatus via a telecommunication line or a recording medium storing the recipes. In addition, the existing recipes already installed in the existing substrate processing apparatus may be directly modified by operating the input/output device 122 of the substrate processing apparatus.

An example in which a film is formed by using a batch-type substrate processing apparatus capable of processing a plurality of substrates at a time has been described in the above-described embodiments. The present disclosure is not limited to the above-described embodiments, but may be suitably applied, for example, to a case where a film is formed by using a single-wafer type substrate processing apparatus capable of processing a single substrate or several substrates at a time. In addition, the example in which a film is formed by using a substrate processing apparatus including a hot-wall-type process furnace has been described in the above-described embodiments. The present disclosure is not limited to the above-described embodiments, but may be suitably applied to a case where a film is formed using a substrate processing apparatus including a cold-wall-type process furnace.

Even in the case of using these substrate processing apparatuses, each process may be performed according to the same processing procedures and process conditions as those in the above-described embodiments and modifications, and the same effects as those in the above-described embodiments and modifications may be achieved.

The above-described embodiments and modifications may be used in proper combination. The processing procedures and process conditions used in this case may be the same as, for example, the processing procedures and process conditions in the above-described embodiments and modifications.

EXAMPLES

First Example

As a first Example, a first evaluation sample is provided by using a wafer having a surface on which a SiO film as a first base and a SiN film as a second base are exposed and performing selective growth of a SiOC film according to the processing sequence in the above-described embodiments. When providing the first evaluation sample, BDAADAS is used as a first modifier, DAATAS is used as a second modifier, a H- and O-containing gas is used as a H- and O-containing substance, and a Si-, C-, and halogen-containing gas, an O- and H-containing gas, and an amine-based gas are used as a precursor gas, a reaction gas, and a catalyst gas, respectively. Before performing the processing sequence in the above-described embodiments, the wafer having the surface on which the SiO film and the SiN film are exposed is immersed in a HF aqueous solution (hereinafter, DHF) in which HF is diluted with $H_2O$ at 1% for 30 seconds. The process condition in each step when providing the first evaluation sample is set to predetermined conditions within the process condition range in each step of the processing sequences of the above-described embodiments.

First Comparative Example

As a first Comparative Example, a second evaluation sample is provided by using the same wafer as the wafer immersed in DHF for 30 seconds in the first Example and performing selective growth of a SiOC film according to the same processing sequence as that in the above-described embodiments except that steps SA1 and SA3 are not performed. When providing the second evaluation sample, a second modifier, a precursor gas, a reaction gas, a catalyst gas, and a process condition in each step are the same as those when providing the first evaluation sample.

Second Comparative Example

As a second Comparative Example, a third evaluation sample is provided by using the same wafer as the wafer immersed in DHF for 30 seconds in the first Example and performing selective growth of a SiOC film according to the same processing sequence as that in the above-described embodiments except that Steps A3 and A2 are not performed. When providing the third evaluation sample, a first modifier, a precursor gas, a reaction gas, a catalyst gas, and a process condition in each step are the same as those when providing the first evaluation sample.

After providing the first to third evaluation samples, a thickness of the SiOC film formed on the SiO film and a thickness of the SiOC film formed on the SiN film are measured in each evaluation sample. Next, a film thickness difference between the thickness of the SiOC film formed on the SiN film and the thickness of the SiOC film formed on the SiO film (hereinafter, simply referred to as a film thickness difference) in each evaluation sample is calculated.

Figure 9:
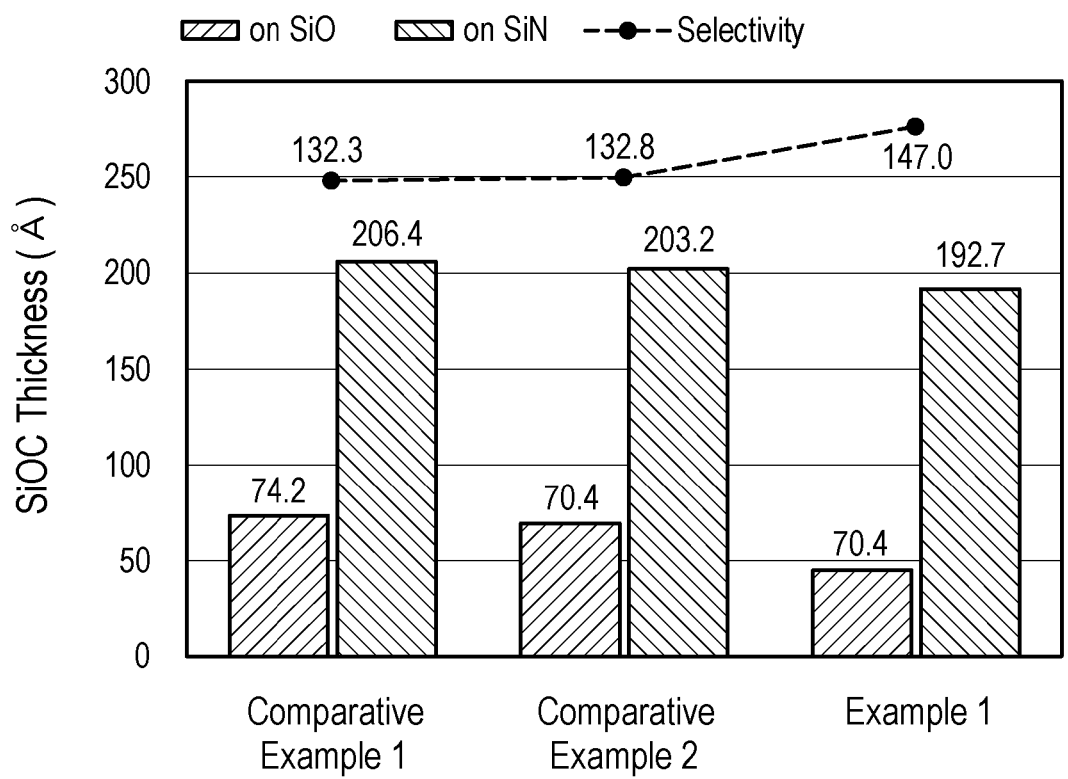
FIG. 9 is a diagram showing evaluation results in Examples.

The results are shown in FIG. 9. In FIG. 9, a horizontal axis represents the first Comparative Example (second evaluation sample), the second Comparative Example (third evaluation sample), and the first Example (first evaluation sample) in order from the left, and a vertical axis represents the film thickness (A) of the SiOC film. In the bar graph, a bar on the left side indicates the film thickness of the SiOC film formed on the SiO film, and a bar on the right side indicates the film thickness of the SiOC film formed on the SiN film. A graph of broken line indicates the film thickness difference. In FIG. 9, this film thickness difference is referred to as selectivity for the sake of convenience. The selectivity becomes better as the film thickness difference is larger, and the selectivity becomes poorer as the film thickness difference is smaller.

It can be seen from FIG. 9 that the film thickness difference in the first Example (first evaluation sample) is much larger than the film thickness differences in the first Comparative Example (second evaluation sample) and the second Comparative Example (third evaluation sample). In this way, according to the first Example, it is confirmed that it is possible to significantly enhance the selectivity in selective growth.

In other film formation evaluations conducted by the present disclosers, not only when the second base is the SiN film, but also when the second base is a single crystal Si, an a-C film, an a-Si film, an AlO film, a SiCN film, or a TiN film, it is confirmed that a SiOC film is selectively formed on these second bases.

According to the present disclosure in some embodiments, it is possible to improve selectivity in selective growth.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A processing method, comprising:
   (a) modifying a first surface of a substrate by supplying a first modifier and a second modifier to the substrate having the first surface and a second surface, wherein the first modifier contains an atom to which at least one first functional group and at least one second functional group are directly bonded, wherein the second modifier contains an atom to which at least one first functional group and at least one second functional group are directly bonded, and wherein the number of the at least one first functional group contained in one molecule of the second modifier is not more than the number of the at least one first functional group contained in one molecule of the first modifier; and
   (b) forming a film on the second surface by supplying a film-forming gas to the substrate after modifying the first surface.

2. The processing method of claim 1, wherein (a) includes:
   (a1) supplying the first modifier to the substrate; and
   (a2) supplying the second modifier to the substrate.

3. The processing method of claim 2, wherein (a) further includes performing (a1) and (a2) in this order.

4. The processing method of claim 3, wherein (a) further includes (a3) supplying an oxygen- and hydrogen-containing substance to the substrate, and
   wherein (a1), (a3), and (a2) are performed in this order.

5. The processing method of claim 4, wherein in (a1), the first modifier is adsorbed on the first surface,
   wherein in (a3), the at least one first functional group of a portion of the first modifier adsorbed on the first surface is substituted with at least one hydroxyl group, and
   wherein in (a2), the second modifier is adsorbed on the at least one hydroxyl group.

6. The processing method of claim 5, wherein in (a1), a portion of the first modifier is adsorbed on the first surface in a state where the portion of the first modifier contains the at least one first functional group.

7. The processing method of claim 5, wherein in (a1), the first modifier is adsorbed on the first surface in a state where the first modifier contains the at least one second functional group, and
   wherein in (a2), the second modifier is adsorbed on the at least one hydroxyl group in a state where the second modifier contains the at least one second functional group.

8. The processing method of claim 5, wherein the at least one hydroxyl group includes a plurality of hydroxyl groups, and wherein in (a1), a portion of the first modifier is adsorbed on the first surface by using a reaction between two hydroxyl groups present on the first surface and adjacent to each other and the one molecule of the first modifier.

9. The processing method of claim 5, wherein in (a), (a1) and (a3) are performed one or more times, or (a1), (a3), and (a2) are performed one or more times.

10. The processing method of claim 4, wherein in (a3), a H2O gas as the oxygen- and hydrogen-containing substance is supplied to the substrate.

11. The processing method of claim 1, wherein the number of the at least one first functional group contained in the one molecule of the first modifier is two, and the number of the at least one first functional group contained in the one molecule of the second modifier is one.

12. The processing method of claim 1, wherein both the first modifier and the second modifier have a structure containing a tetravalent atom to which the at least one first functional group and the at least one second functional group are directly bonded.

13. The processing method of claim 1, wherein the at least one first functional group contains an amino group or a substituted amino group.

14. The processing method of claim 1, wherein the at least one second functional group contains a hydrocarbon group.

15. The processing method of claim 1, wherein the at least one second functional group contains an alkyl group.

16. The processing method of claim 1, wherein (a) further includes (a4) exposing the surface of the substrate to a hydrogen fluoride aqueous solution before performing (a1).

17. The processing method of claim 1, wherein the first base is an oxide film, and the second base is a film other than the oxide film.

18. A method of manufacturing a semiconductor device comprising the processing method of claim 1.

19. A processing apparatus comprising:
   a first modifier supply system configured to supply a first modifier to a substrate, wherein the first modifier contains an atom to which at least one first functional group and at least one second functional group are directly bonded;

a second modifier supply system configured to supply a second modifier to the substrate, wherein the second modifier contains an atom to which at least one first functional group and at least one second functional group are directly bonded and wherein the number of the at least one first functional group contained in one molecule of the second modifier is not more than the number of the at least one first functional group contained in one molecule of the first modifier;

a film-forming gas supply system configured to supply a film-forming gas to the substrate; and a controller configured to be capable of controlling the first modifier supply system, the second modifier supply system, and the film-forming gas supply system to perform a process including: (a) modifying a first surface of the substrate by supplying the first modifier and the second modifier to the substrate having the first surface and a second surface; and (b) forming a film on the second surface by supplying the film-forming gas to the substrate after modifying the first surface.

20. A non-transitory computer-readable recording medium storing a program that causes, by a computer, a processing apparatus to perform a process comprising:

(a) modifying a first surface of a substrate by supplying a first modifier and a second modifier to the substrate having the first surface and a second surface, wherein the first modifier contains an atom to which at least one first functional group and at least one second functional group are directly bonded, wherein the second modifier contains an atom to which at least one first functional group and at least one second functional group are directly bonded, and wherein the number of the at least one first functional group contained in one molecule of the second modifier is not more than the number of the at least one first functional group contained in one molecule of the first modifier; and (b) forming a film on the second surface by supplying a film-forming gas to the substrate after modifying the first surface.

* * * * *